United States Patent
Shanbhag et al.

(10) Patent No.: US 12,227,837 B2
(45) Date of Patent: *Feb. 18, 2025

(54) EX SITU COATING OF CHAMBER COMPONENTS FOR SEMICONDUCTOR PROCESSING

(71) Applicant: Lam Research Corporation, Fremont, CA (US)

(72) Inventors: Damodar Rajaram Shanbhag, Beaverton, OR (US); Guangbi Yuan, Beaverton, OR (US); Thadeous Bamford, Portland, OR (US); Curtis Warren Bailey, West Linn, OR (US); Tony Kaushal, Campbell, CA (US); Krishna Birru, Fremont, CA (US); William Schlosser, Tigard, OR (US); Bo Gong, Sherwood, OR (US); Huatan Qiu, Portland, OR (US); Fengyuan Lai, Sherwood, OR (US); Leonard Wai Fung Kho, San Francisco, CA (US); Anand Chandrashekar, Fremont, CA (US); Andrew H. Breninger, Hillsboro, OR (US); Chen-Hua Hsu, Sherwood, OR (US); Geoffrey Hohn, Portland, OR (US); Gang Liu, Fremont, CA (US); Rohit Khare, San Ramon, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/663,614

(22) Filed: May 16, 2022

(65) Prior Publication Data
US 2022/0275504 A1 Sep. 1, 2022

Related U.S. Application Data

(63) Continuation of application No. 16/935,760, filed on Jul. 22, 2020, now Pat. No. 11,365,479, which is a
(Continued)

(51) Int. Cl.
*C23C 16/44* (2006.01)
*C23C 16/40* (2006.01)
(Continued)

(52) U.S. Cl.
CPC ........ *C23C 16/4404* (2013.01); *C23C 16/401* (2013.01); *C23C 16/4405* (2013.01);
(Continued)

(58) Field of Classification Search
CPC ............ C23C 16/4404; C23C 16/4405; C23C 16/45536; C23C 16/45565
See application file for complete search history.

(56) References Cited

U.S. PATENT DOCUMENTS

| 4,410,395 A | 10/1983 | Weaver et al. |
| 4,892,753 A | 1/1990 | Wang et al. |

(Continued)

FOREIGN PATENT DOCUMENTS

| CN | 1798867 A | 7/2006 |
| CN | 1883037 A | 12/2006 |

(Continued)

OTHER PUBLICATIONS

Hetmańczyk, M., "Advanced materials and protective coatings in aero-engines application". Journal of Achievements of Materials and Manufacturing Engineering, vol. 24, Issue 1, Sep. 2007, pp. 372-381.*

(Continued)

*Primary Examiner* — Bret P Chen
(74) *Attorney, Agent, or Firm* — Weaver Austin Villeneuve & Sampson LLP

(57) ABSTRACT

Forming a protective coating ex situ in an atomic layer deposition process to coat one or more chamber components subsequently installed in a reaction chamber provides a number of benefits over more conventional coating methods such as in situ deposition of an undercoat. In certain cases the protective coating may have a particular composition such as aluminum oxide, aluminum fluoride, aluminum nitride, yttrium oxide, and/or yttrium fluoride. The protective coating may help reduce contamination on wafers processed using the coated chamber component. Further, the protective coating may act to stabilize the processing conditions within the reaction chamber, thereby achieving very stable/uniform processing results over the course of processing many batches of wafers, and minimizing radical loss. Also described are a number of techniques that may be used (Continued)

to restore the protective coating after the coated chamber component is used to process semiconductor wafers.

19 Claims, 13 Drawing Sheets

Related U.S. Application Data continuation of application No. 15/954,454, filed on Apr. 16, 2018, now Pat. No. 10,760,158.

(60) Provisional application No. 62/599,618, filed on Dec. 15, 2017.

(51) Int. Cl.
C23C 16/455 (2006.01)
H01J 37/32 (2006.01)

(52) U.S. Cl.
CPC .. C23C 16/45519 (2013.01); C23C 16/45536 (2013.01); C23C 16/45565 (2013.01); H01J 37/3244 (2013.01); H01J 37/32862 (2013.01)

(56) References Cited

U.S. PATENT DOCUMENTS

| | | | |
|---|---|---|---|
| 5,154,810 A | 10/1992 | Kamerling et al. | |
| 5,443,686 A | 8/1995 | Jones et al. | |
| 5,605,859 A | 2/1997 | Lee | |
| 5,647,953 A | 7/1997 | Williams et al. | |
| 5,654,475 A | 8/1997 | Vassiliou et al. | |
| 5,811,356 A | 9/1998 | Murugesh et al. | |
| 5,824,375 A | 10/1998 | Gupta | |
| 5,902,135 A | 5/1999 | Schulze | |
| 5,970,383 A | 10/1999 | Lee | |
| 6,071,573 A | 6/2000 | Koemtzopoulos et al. | |
| 6,121,161 A | 9/2000 | Rossman et al. | |
| 6,121,164 A | 9/2000 | Yieh et al. | |
| 6,162,323 A | 12/2000 | Koshimizu | |
| 6,223,685 B1 | 5/2001 | Gupta et al. | |
| 6,416,577 B1 | 7/2002 | Suntoloa et al. | |
| 6,449,521 B1 | 9/2002 | Gupta | |
| 6,475,336 B1 | 11/2002 | Hubacek | |
| 6,534,380 B1 | 3/2003 | Yamauchi et al. | |
| 6,626,186 B1 | 9/2003 | Hillman et al. | |
| 6,626,188 B2 | 9/2003 | Fitzsimmons et al. | |
| 6,696,362 B2 | 2/2004 | Rossman et al. | |
| 6,749,098 B2 | 6/2004 | Roier et al. | |
| 6,776,873 B1* | 8/2004 | Sun | C23C 28/00 118/723 R |
| 6,815,007 B1 | 11/2004 | Yoo et al. | |
| 6,818,570 B2 | 11/2004 | Tsuji et al. | |
| 6,819,969 B2 | 11/2004 | Lee et al. | |
| 6,933,254 B2 | 8/2005 | Morita et al. | |
| 7,118,779 B2 | 10/2006 | Verghese et al. | |
| 7,138,332 B2 | 11/2006 | Goundar | |
| 7,183,177 B2 | 2/2007 | Al-Bayati et al. | |
| 7,204,913 B1 | 4/2007 | Singh et al. | |
| 7,232,492 B2 | 6/2007 | Won et al. | |
| 7,241,690 B2 | 7/2007 | Pavone et al. | |
| 7,288,284 B2 | 10/2007 | Li et al. | |
| 7,601,639 B2 | 10/2009 | Pavone et al. | |
| 7,704,894 B1 | 4/2010 | Henri et al. | |
| 7,767,584 B1 | 8/2010 | Singh et al. | |
| 7,799,135 B2 | 9/2010 | Verghese et al. | |
| 7,914,847 B2 | 3/2011 | Verghese et al. | |
| 7,923,376 B1 | 4/2011 | Dhas et al. | |
| 8,017,527 B1 | 9/2011 | Dhas et al. | |
| 8,088,296 B2 | 1/2012 | Yamazaki | |
| 8,101,531 B1 | 1/2012 | Li et al. | |
| 8,163,087 B2 | 4/2012 | Faguet et al. | |
| 8,206,829 B2* | 6/2012 | Sun | H01J 37/32477 427/523 |
| 8,293,658 B2 | 10/2012 | Shero et al. | |
| 9,034,142 B2* | 5/2015 | Bartlett | C23C 16/4557 156/345.33 |
| 9,228,259 B2 | 1/2016 | Haukka et al. | |
| 9,328,416 B2 | 5/2016 | Dhas et al. | |
| 9,493,875 B2* | 11/2016 | Um | C23C 16/45565 |
| 9,601,693 B1 | 3/2017 | Henri et al. | |
| 9,745,658 B2 | 8/2017 | Kang et al. | |
| 9,803,277 B1 | 10/2017 | Longrie et al. | |
| 9,805,974 B1 | 10/2017 | Chen et al. | |
| 9,828,672 B2 | 11/2017 | Varadarajan et al. | |
| 9,850,573 B1 | 12/2017 | Sun | |
| 9,869,020 B2 | 1/2018 | Malinen et al. | |
| 10,023,956 B2 | 7/2018 | Cui et al. | |
| 10,134,569 B1 | 11/2018 | Albarede et al. | |
| 10,211,099 B2 | 2/2019 | Wang et al. | |
| 10,704,141 B2 | 7/2020 | Malik et al. | |
| 10,745,805 B2 | 8/2020 | Firouzdor et al. | |
| 10,760,158 B2* | 9/2020 | Shanbhag | C23C 16/405 |
| 11,365,479 B2* | 6/2022 | Shanbhag | H01J 37/32862 |
| 11,761,079 B2 | 9/2023 | Lai et al. | |
| 11,920,239 B2 | 3/2024 | Varadarajan et al. | |
| 2001/0006835 A1 | 7/2001 | Kim et al. | |
| 2001/0007244 A1 | 7/2001 | Matsuse | |
| 2002/0073922 A1 | 6/2002 | Frankel et al. | |
| 2002/0076490 A1 | 6/2002 | Chiang et al. | |
| 2002/0092763 A1 | 7/2002 | Denning et al. | |
| 2002/0192359 A1 | 12/2002 | Johnson | |
| 2003/0013314 A1 | 1/2003 | Ying et al. | |
| 2003/0031793 A1 | 2/2003 | Chang et al. | |
| 2003/0091753 A1* | 5/2003 | Han | C23C 16/4404 118/723 R |
| 2003/0127049 A1 | 7/2003 | Han et al. | |
| 2003/0159657 A1* | 8/2003 | Kaushal | H01J 37/32495 118/723 R |
| 2003/0203123 A1 | 10/2003 | Shang et al. | |
| 2004/0023516 A1 | 2/2004 | Londergan et al. | |
| 2004/0025903 A1 | 2/2004 | Howard | |
| 2004/0045503 A1 | 3/2004 | Lee et al. | |
| 2004/0134427 A1 | 7/2004 | Derderian et al. | |
| 2004/0149386 A1 | 8/2004 | Numasawa et al. | |
| 2004/0182833 A1 | 9/2004 | Fink | |
| 2005/0068519 A1* | 3/2005 | O'Meara | G01N 21/55 356/72 |
| 2005/0130427 A1 | 6/2005 | Won et al. | |
| 2005/0214455 A1 | 9/2005 | Li et al. | |
| 2005/0221001 A1 | 10/2005 | Joe et al. | |
| 2005/0221020 A1 | 10/2005 | Fukiage | |
| 2006/0046470 A1 | 3/2006 | Becknell et al. | |
| 2006/0093756 A1 | 5/2006 | Rajagopalan et al. | |
| 2006/0189171 A1 | 8/2006 | Chua et al. | |
| 2006/0269691 A1 | 11/2006 | Saki | |
| 2006/0280868 A1 | 12/2006 | Kato et al. | |
| 2007/0037348 A1 | 2/2007 | Shin et al. | |
| 2007/0056843 A1 | 3/2007 | Ye et al. | |
| 2007/0111458 A1 | 5/2007 | Sato et al. | |
| 2007/0201016 A1 | 8/2007 | Song et al. | |
| 2007/0269992 A1 | 11/2007 | Yang et al. | |
| 2008/0066677 A1 | 3/2008 | Morozumi et al. | |
| 2008/0094775 A1 | 4/2008 | Sneh et al. | |
| 2008/0110760 A1* | 5/2008 | Han | C23C 30/005 204/279 |
| 2008/0118663 A1 | 5/2008 | Choi et al. | |
| 2008/0124901 A1* | 5/2008 | Jyogo | C23C 16/4404 118/725 |
| 2008/0149032 A1 | 6/2008 | Jung | |
| 2008/0178803 A1 | 7/2008 | Collins et al. | |
| 2008/0202688 A1* | 8/2008 | Wu | H01J 37/32559 156/345.34 |
| 2008/0286982 A1 | 11/2008 | Li et al. | |
| 2008/0302281 A1 | 12/2008 | Bernard et al. | |
| 2009/0041952 A1 | 2/2009 | Yoon et al. | |
| 2009/0197401 A1 | 8/2009 | Li et al. | |
| 2009/0200269 A1 | 8/2009 | Kadkhodayan et al. | |
| 2009/0242511 A1 | 10/2009 | Shimazu et al. | |
| 2009/0253269 A1 | 10/2009 | Tsuneda | |
| 2009/0260571 A1* | 10/2009 | Ostrowski | C23C 16/45565 118/728 |
| 2009/0278116 A1 | 11/2009 | Yamate | |

(56) References Cited

U.S. PATENT DOCUMENTS

| | | |
|---|---|---|
| 2009/0294881 A1 | 12/2009 | Murata et al. |
| 2009/0308840 A1 | 12/2009 | Kohno et al. |
| 2009/0325391 A1 | 12/2009 | De Vusser et al. |
| 2010/0048028 A1 | 2/2010 | Rasheed et al. |
| 2010/0104760 A1 | 4/2010 | Matsui et al. |
| 2010/0186512 A1 | 7/2010 | Goto et al. |
| 2010/0190352 A1 | 7/2010 | Jaiswal |
| 2010/0243192 A1 | 9/2010 | Balasubramanian et al. |
| 2011/0045676 A1 | 2/2011 | Park et al. |
| 2011/0056626 A1 | 3/2011 | Brown et al. |
| 2011/0070380 A1 | 3/2011 | Shero et al. |
| 2011/0151142 A1 | 6/2011 | Seamons et al. |
| 2011/0230008 A1 | 9/2011 | Lakshmanan et al. |
| 2011/0256726 A1 | 10/2011 | LaVoie et al. |
| 2011/0262650 A1 | 10/2011 | Lee |
| 2011/0315186 A1 | 12/2011 | Gee et al. |
| 2012/0097330 A1 | 4/2012 | Iyengar et al. |
| 2012/0122319 A1 | 5/2012 | Shimizu |
| 2012/0181166 A1 | 7/2012 | Luo et al. |
| 2012/0237693 A1 | 9/2012 | Jackson et al. |
| 2012/0251737 A1 | 10/2012 | Osaki et al. |
| 2013/0012030 A1 | 1/2013 | Lakshmanan et al. |
| 2013/0014896 A1* | 1/2013 | Shoji ............... C23C 16/402 427/256 |
| 2013/0017685 A1 | 1/2013 | Akae et al. |
| 2013/0064973 A1 | 3/2013 | Chen et al. |
| 2013/0089988 A1 | 4/2013 | Wang et al. |
| 2013/0122711 A1 | 5/2013 | Marakhtanov et al. |
| 2013/0135155 A1* | 5/2013 | Zhang ............... H01Q 1/48 343/700 MS |
| 2013/0302980 A1 | 11/2013 | Chandrashekar et al. |
| 2013/0330935 A1 | 12/2013 | Varadarajan |
| 2014/0065835 A1* | 3/2014 | Kadkhodayan ..... H01L 21/3065 438/758 |
| 2014/0106573 A1 | 4/2014 | Terasaki et al. |
| 2014/0120738 A1 | 5/2014 | Jung et al. |
| 2014/0127852 A1 | 5/2014 | De Souza et al. |
| 2014/0158674 A1 | 6/2014 | Moffatt et al. |
| 2014/0184705 A1 | 7/2014 | Wakamatsu et al. |
| 2014/0209026 A1 | 7/2014 | LaVoie et al. |
| 2014/0272184 A1 | 9/2014 | Sreekala et al. |
| 2014/0295670 A1 | 10/2014 | Shih et al. |
| 2014/0302254 A1* | 10/2014 | Sang ............... C23C 16/4405 427/535 |
| 2014/0319544 A1 | 10/2014 | Hwang |
| 2014/0356549 A1 | 12/2014 | Varadarajan |
| 2015/0017335 A1 | 1/2015 | Werner |
| 2015/0147482 A1 | 5/2015 | Kang et al. |
| 2015/0203967 A1 | 7/2015 | Dhas et al. |
| 2015/0218700 A1* | 8/2015 | Nguyen ............... C23C 16/56 427/255.39 |
| 2015/0221553 A1 | 8/2015 | Ouye |
| 2015/0228496 A1 | 8/2015 | Nakano |
| 2015/0270107 A1 | 9/2015 | Zhao et al. |
| 2015/0307982 A1 | 10/2015 | Firouzdor et al. |
| 2015/0345017 A1 | 12/2015 | Chang et al. |
| 2015/0361547 A1 | 12/2015 | Lin et al. |
| 2016/0016286 A1 | 1/2016 | Suh et al. |
| 2016/0099147 A1* | 4/2016 | Kulshreshtha ......... C23C 16/26 118/725 |
| 2016/0281230 A1 | 9/2016 | Varadarajan et al. |
| 2016/0300713 A1 | 10/2016 | Cui et al. |
| 2016/0329206 A1 | 11/2016 | Kumar et al. |
| 2016/0375515 A1 | 12/2016 | Xu et al. |
| 2017/0152968 A1 | 6/2017 | Raj et al. |
| 2017/0204516 A1* | 7/2017 | Nguyen ............... C23C 16/4404 |
| 2017/0301522 A1 | 10/2017 | Sun et al. |
| 2017/0314125 A1* | 11/2017 | Fenwick ............... C23C 16/405 |
| 2017/0314128 A1 | 11/2017 | Kang et al. |
| 2017/0323772 A1* | 11/2017 | Fenwick ............... C23C 14/082 |
| 2018/0016678 A1 | 1/2018 | Fenwick et al. |
| 2018/0044791 A1 | 2/2018 | Varadarajan et al. |
| 2018/0057939 A1 | 3/2018 | Yun et al. |
| 2018/0127864 A1 | 5/2018 | Latchford et al. |
| 2018/0174901 A1 | 6/2018 | Wang et al. |
| 2018/0202047 A1 | 7/2018 | Lin et al. |
| 2018/0265972 A1 | 9/2018 | Firouzdor et al. |
| 2018/0265973 A1 | 9/2018 | Firouzdor et al. |
| 2018/0337026 A1 | 11/2018 | Firouzdor et al. |
| 2018/0347037 A1 | 12/2018 | Zhai et al. |
| 2019/0078206 A1 | 3/2019 | Wu et al. |
| 2019/0131113 A1* | 5/2019 | Fenwick ............... C23C 14/3442 |
| 2019/0185999 A1 | 6/2019 | Shanbhag et al. |
| 2019/0271076 A1 | 9/2019 | Fenwick et al. |
| 2020/0058469 A1 | 2/2020 | Ranjan et al. |
| 2020/0347497 A1 | 11/2020 | Shanbhag et al. |
| 2021/0071300 A1* | 3/2021 | Bajaj ............... H01J 37/32467 |
| 2021/0164097 A1 | 6/2021 | Lai et al. |
| 2021/0340670 A1 | 11/2021 | Singhal et al. |
| 2022/0145459 A1 | 5/2022 | Varadarajan et al. |
| 2023/0002891 A1 | 1/2023 | Shanbhag et al. |
| 2023/0383401 A1 | 11/2023 | Lai et al. |

FOREIGN PATENT DOCUMENTS

| | | |
|---|---|---|
| CN | 101053063 A | 10/2007 |
| CN | 101312126 A | 11/2008 |
| CN | 101313085 A | 11/2008 |
| CN | 101764044 A | 6/2010 |
| CN | 102892922 A | 1/2013 |
| CN | 103098174 A | 5/2013 |
| CN | 103219227 A | 7/2013 |
| CN | 103243310 A | 8/2013 |
| CN | 104272440 A | 1/2015 |
| CN | 104651807 A | 5/2015 |
| CN | 105378900 A | 3/2016 |
| CN | 106169420 A | 11/2016 |
| CN | 106270863 A | 1/2017 |
| CN | 107313027 A | 11/2017 |
| JP | S58151031 A | 9/1983 |
| JP | H07326581 A | 12/1995 |
| JP | H0822980 A | 1/1996 |
| JP | H0871408 A | 3/1996 |
| JP | H09330885 A | 12/1997 |
| JP | 2001123271 A | 5/2001 |
| JP | 2001271170 A | 10/2001 |
| JP | 2003224076 A | 8/2003 |
| JP | 2003297817 A | 10/2003 |
| JP | 2004511901 A | 4/2004 |
| JP | 2005085878 A | 3/2005 |
| JP | 2006100705 A | 4/2006 |
| JP | 2007049162 A | 2/2007 |
| JP | 2008187179 A | 8/2008 |
| JP | 2009094340 A | 4/2009 |
| JP | 2009147373 A | 7/2009 |
| JP | 2009188198 A | 8/2009 |
| JP | 2009263764 A | 11/2009 |
| JP | 2010103443 A | 5/2010 |
| JP | 2010147238 A | 7/2010 |
| JP | 2011020995 A | 2/2011 |
| JP | 2011124274 A | 6/2011 |
| JP | 2011124472 A | 6/2011 |
| JP | 2011187934 A | 9/2011 |
| JP | 2012216631 A | 11/2012 |
| JP | 2012216696 A | 11/2012 |
| JP | 2013179321 A | 9/2013 |
| JP | 2014125653 A | 7/2014 |
| JP | 2014532304 A | 12/2014 |
| JP | 2015122486 A | 7/2015 |
| JP | 2016051864 A | 4/2016 |
| JP | 2016216817 A | 12/2016 |
| JP | 2017512375 A | 5/2017 |
| JP | 2017514991 A | 6/2017 |
| JP | 2017199907 A | 11/2017 |
| KR | 19980018744 A | 6/1998 |
| KR | 100382370 B1 | 5/2003 |
| KR | 20040022056 A | 3/2004 |
| KR | 20060055138 A | 5/2006 |
| KR | 20070030596 A | 3/2007 |
| KR | 20070085564 A | 8/2007 |
| KR | 20080071493 A | 8/2008 |
| KR | 20080101740 A | 11/2008 |
| KR | 20080105539 A | 12/2008 |

(56) References Cited

FOREIGN PATENT DOCUMENTS

| KR | 20090016403 A | 2/2009 | |
|---|---|---|---|
| KR | 20090053823 A | 5/2009 | |
| KR | 20100120199 A | 11/2010 | |
| KR | 20110053360 A | 5/2011 | |
| KR | 20120057570 A | 6/2012 | |
| KR | 20130005307 A | 1/2013 | |
| KR | 20130055582 A | 5/2013 | |
| KR | 20140034115 A | 3/2014 | |
| KR | 20140141686 A | 12/2014 | |
| KR | 20150060583 A | 6/2015 | |
| KR | 20150086197 A | 7/2015 | |
| KR | 20150143233 A | 12/2015 | |
| KR | 20160115761 A | 10/2016 | |
| KR | 20170122674 A | 11/2017 | |
| TW | 200535277 A | 11/2005 | |
| TW | 200830942 A | 7/2008 | |
| TW | 200917363 A | 4/2009 | |
| TW | 201405707 A | 2/2014 | |
| TW | 201405781 A | 2/2014 | |
| TW | 201425633 A | 7/2014 | |
| TW | 201626503 A | 7/2016 | |
| TW | 1609455 B | 12/2017 | |
| WO | WO-2006054854 A1 | 5/2006 | |
| WO | WO-2007027350 A2 | 3/2007 | |
| WO | WO-2009085117 A2 | 7/2009 | |
| WO | WO-2011111498 A1 | 9/2011 | |
| WO | WO-2013043330 A1 | 3/2013 | |
| WO | WO 2014/137532 A1 * | 9/2014 | ......... H01L 21/3065 |
| WO | WO-2016131024 A1 | 8/2016 | |
| WO | WO-2021029970 A1 | 2/2021 | |
| WO | WO-2021050168 A1 | 3/2021 | |

OTHER PUBLICATIONS

Entegris brochure "Three Successful Precision Engineered Techniques for Coating Plasma Chamber Components". 2019, 4 pages.*
Komiya, S. et al., "Titanium nitride film as a protective coating for a vacuum deposition chamber". Thin Solid Films, vol. 63, Issue 2, Nov. 1, 1979, pp. 341-346.*
Advanced Energy Industries, Inc. brochure. "Remote Plasma Source Chamber Anodization". 2018, pp. 1-8.
Chinese First Office Action dated Jun. 3, 2019 issued in Application No. CN 201711372325.2.
Chinese First Office Action, dated Mar. 20, 2018 issued in Application No. CN 201610181756.X.
Chinese First Office Action, dated Sep. 5, 2016, issued in Application No. CN 201410686823.4.
Chinese Notice of Allowance, dated Mar. 3, 2020 issued in Application No. CN 201610181756.X.
Chinese Second Office Action, dated Jan. 28, 2019 issued in Application No. CN 201610181756.X.
Chinese Second Office Action dated May 7, 2020 issued in Application No. CN 201711372325.2.
Chinese Second Office Action, dated May 8, 2017, issued in Application No. CN 201410686823.4.
Chinese Third Office Action, dated Aug. 2, 2019 issued in Application No. CN 201610181756.X.
Chinese Third Office Action dated Dec. 1, 2020 issued in Application No. CN 201711372325.2.
Cunge et al. (2005) "New chamber walls conditioning and cleaning strategies to improve the stability of plasma processes," Plasma Sources Sci. Technol. 14:509-609.
Cunge et al. (2005) "Plasma-wall interactions during silicon etching processes in high-density HBr/C12/O2 plasmas," Plasma Sources Sci. Technol. 14:S42-S52.
Fotovvati, Behzad, et al., "On Coating Techniques for Surface Protection: A Review" Journal of Manufacturing and Materials Processing, 2019, 3, 28, pp. 1-22.
Hu, L, et al., "Coating Strategies for Atomic Layer Deposition". Nanotechnology. Jan. 2017, vol. 6, No. 6, pp. 527-547.
International Preliminary Report and Patentability dated Apr. 29, 2021 issued in PCT/US2019/055264.
International Preliminary Report and Patentability dated Jun. 25, 2020 issued in PCT/US2018/064090.
International Preliminary Report on Patentability dated Jun. 18, 2020 in PCT Application No. PCT/US2018/064304.
International Search Report and Written Opinion dated Apr. 1, 2019, in PCT Application No. PCT/US2018/064304.
International Search Report dated Feb. 5, 2020 issued in PCT/US2019/055264.
International Search Report dated Mar. 22, 2019 issued in Application No. PCT/US2018/064090.
Japanese First Office Action, dated Aug. 18, 2021, issued in Application No. JP 2020-185592.
Japanese First Office Action, dated Jan. 8, 2019, issued in Application No. JP 2014-233410.
Japanese First Office Action, dated Mar. 10, 2020 issued in Application No. JP 2016-054587.
Japanese Second Office Action, dated Dec. 15, 2020 issued in Application No. JP 2016-054587.
Japanese Second Office Action, dated Nov. 19, 2019, issued in Application No. JP 2014-233410.
Japanese Third Office Action, dated Jul. 3, 2020, issued in Application No. JP 2014-233410.
Japanese Third Office Action, dated Sep. 10, 2021 issued in Application No. JP 2016-054587.
JP Office Action dated Feb. 8, 2022, in Application No. JP2020-185592 with English translation.
Juárez, H., et al., (2009) "Low temperature deposition: properties of Si02 films from TEOS and ozone by APCVD system," XIX Latin American Symposium on Solid State Physics (SLAFES XIX). Journal of Physics: Conference Series 167(012020) pp. 1-6.
Kang et al. (Jul./Aug. 2005) "Evaluation of silicon oxide cleaning using F2/Ar remote plasma processing," J. Vac. Sci. Technol. A 23(4):911-916.
Kim et al. (1991) "Recombination of O, N, and H Atoms on Silica: Kinetics and Mechanism," Langmuir, 7(12):2999-3005.
Kim et al. (2015) "Investigation of Plasma Enhanced Chemical Vapor Deposition Chamber Mismatching by Photoluminescence and Raman Spectroscopy," ECS Journal of Solid State Science and Technology, 4(8)P314-P318.
Klimecky et al. (May/Jun. 2003) "Compensation for transient chamber wall condition using real- time plasma density feedback control in an inductively coupled plasma etcher," Journal Vac. Sci. Technol. A, 21(3):706-717.
Knoops et al. (2010) "Conformality of Plasma-Assisted ALD: Physical Processes and Modeling," Journal of The Electrochemical Society, 157(12):G241-G249.
Korean First Office Action dated Apr. 16, 2021 issued in Application No. KR 10-2015-0007827.
Korean First Office Action, dated Jul. 1, 2021, issued in Application No. KR 10-2014-0165420.
KR Office Action dated Apr. 20, 2022, in Application No. KR10-2022-0020744 with English translation.
KR Office Action dated Aug. 1, 2022, in Application No. 10-2017-0172906.
KR Office Action dated Dec. 21, 2021, in Application No. KR1020140165420 with English translation.
KR Office Action dated Feb. 8, 2022, in Application No. 10-2017-0172906 with English translation.
KR Office Action dated Jun. 1, 2022, in Application No. KR10-2014-0165420 with English Translation.
KR Office Action dated Jun. 9, 2022, in Application No. KR10-2022-0017172 with English translation.
KR Office Action dated Mar. 10, 2022, in Application No. KR1020220017172 with English translation.
KR Office Action dated May 26, 2022, in Application No. KR10-2016-0042618 With English Translation.
KR Office Action dated Nov. 17, 2021, in Application No. KR1020150007827 with English translation.

(56) References Cited

OTHER PUBLICATIONS

Lin, Tzu-Ken, et al., Comparison of Erosion Behavior and Particle Contamination in Mass-Production CF4/O2 Plasma Chambers Using Y2O3 and YF3 Protective Coatings. Nanomaterials, 2017, 7, 183, pp. 1-9.
Lin, Tzu-Ken, et al., "Preparation and Characterization of Sprayed-Yttrium Oxyfluoride Corrosion Protective Coating for Plasma Process Chambers" Coatings, 2018, 8, 373, Oct. 22, 2018, pp. 1-8.
Nakagawa, Takahide (May 1991) "Effect of Coating on the Plasma Chamber Wall in RIKEN Electron Cyclotron Resonance Ion Source," Japanese Journal of Applied Physics, 30(5B)L930-L932.
Notice of Allowance, dated Mar. 22, 2018, issued in U.S. Appl. No. 14/683,022.
Park, Seung Hyun, et al., "Surface Analysis of Chamber Coating Materials Exposed to CF4/O2 Plasma". Coatings, 2021, 11, 105, pp. 1-11.
Taiwanese First Office Action dated Apr. 21, 2021 issued in Application No. TW 106144306.
Taiwanese First Office Action dated Apr. 30, 2018 issued in Application No. TW 103140644.
Taiwanese First Office Action dated Oct. 16, 2019 issued in Application No. TW 105109337.
Taiwanese Notice of Allowance dated Apr. 17, 2020 issued in Application No. TW 105109337.
Taiwanese Notice of Allowance dated Aug. 10, 2018 issued in Application No. TW 104101422.
TW Office Action dated May 9, 2022, in Application No. TW107144472 with English translation.
U.S Advisory Action dated Apr. 22, 2022 in U.S. Appl. No. 16/770,526.
U.S Corrected Notice of Allowance dated Mar. 3, 2022, in U.S. Appl. No. 16/935,760.
U.S. Final Office Action, dated Apr. 20, 2017, issued in U.S. Appl. No. 14/712,167.
U.S. Final Office Action dated Aug. 16, 2018 issued in U.S. Appl. No. 15/650,731.
U.S. Final Office Action, dated Dec. 17, 2021, issued in U.S. Appl. No. 15/794,786.
U.S. Final Office Action, dated Jan. 15, 2020, issued in U.S. Appl. No. 15/954,454.
U.S. Final Office Action, dated Jul. 6, 2020, issued in U.S. Appl. No. 15/794,786.
U.S. Final Office Action, dated Jun. 18, 2018, issued in U.S. Appl. No. 15/384,175.
U.S. Final Office Action, dated Nov. 3, 2017, issued in U.S. Appl. No. 14/683,022.
U.S. Final Office Action dated Oct. 28, 2016 issued in U.S. Appl. No. 14/089,653.
U.S. Non-Final Office Action dated Aug. 5, 2022, in U.S. Appl. No. 17/649,020.
U.S. Non-Final office Action dated May 9, 2022 in U.S. Appl. No. 16/770,526.
US Notice of Allowance, dated Apr. 22, 2020, issued in U.S. Appl. No. 15/954,454.
US Notice of Allowance, dated Aug. 18, 2017, issued in U.S. Appl. No. 14/712,167.
U.S. Notice of Allowance dated Feb. 16, 2022 in U.S. Appl. No. 16/935,760.
U.S. Notice of Allowance, dated Jan. 11, 2016, issued in U.S. Appl. No. 14/158,536.
U.S. Notice of Allowance dated Jan. 23, 2017 issued in U.S. Appl. No. 14/089,653.
U.S. Notice of Allowance dated Jun. 1, 2017 issued in U.S. Appl. No. 14/089,653.
U.S. Notice of Allowance, dated May 8, 2019, issued in U.S. Appl. No. 15/782,410.
U.S. Notice of Allowance, dated Oct. 3, 2018, issued in U.S. Appl. No. 15/384,175.
U.S. Office Action, dated Aug. 17, 2015, issued in U.S. Appl. No. 14/158,536.
U.S. Office Action dated Dec. 10, 2015 issued in U.S. Appl. No. 14/089,653.
U.S. Office Action, dated Feb. 28, 2020, issued in U.S. Appl. No. 15/794,786.
U.S. Office Action, dated Jan. 24, 2019, issued in U.S. Appl. No. 15/782,410.
U.S. Office Action, dated Jan. 29, 2021, issued in U.S. Appl. No. 15/794,786.
U.S. Office Action dated Mar. 14, 2018 issued in U.S. Appl. No. 15/650,731.
U.S. Office Action, dated Mar. 24, 2017, issued in U.S. Appl. No. 14/683,022.
U.S. Office Action dated May 13, 2016 issued in U.S. Appl. No. 14/089,653.
U.S. Office Action, dated Nov. 18, 2016, issued in U.S. Appl. No. 14/712,167.
U.S. Office Action, dated Nov. 20, 2017, issued in U.S. Appl. No. 15/384,175.
U.S. Office Action, dated Oct. 8, 2019, issued in U.S. Appl. No. 15/954,454.
U.S. Office Action, dated Sep. 28, 2021, issued in U.S. Appl. No. 16/935,760.
U.S. Office Action, dated Sep. 3, 2021, issued in U.S. Appl. No. 15/794,786.
U.S. Restriction Requirement dated Mar. 29, 2022, in U.S. Appl. No. 17/649,020.
CN Office Action dated Oct. 12, 2023, in application No. CN202110637340.5 with English translation.
Japanese Office Action dated Feb. 14, 2023 issued in Application No. JP2022-004040 with English translation.
JP Office Action dated Mar. 28, 2023 in Application No. JP2020-532621 with English translation.
JP Office Action dated Nov. 15, 2022, in Application No. JP2020-532621 with English translation.
JP Office Action dated Sep. 19, 2023 in Application No. JP2021-521275 with English Translation.
KR Office Action dated Oct. 14, 2022, in Application No. KR10-2022-7018308, with English Translation.
KR Office Action dated Apr. 14, 2023 in Application No. KR10-2016-0034431 with English translation.
KR Office Action dated Aug. 1, 2022, in Application No. 10-2017-0172906 with English translation.
KR Office Action dated Aug. 30, 2023, in Application No. KR10-2020-7020362 with English translation.
KR Office Action dated Feb. 14, 2023 in Application No. KR10-2023-0013752 with English translation.
KR Office Action dated Feb. 27, 2023, in Application No. KR10-2022-7018308, with English Translation.
KR Office Action dated Mar. 22, 2023 in Application No. KR10-2016-0042618 with English translation.
KR Office Action dated May 1, 2023 in Application No. KR10-2022-0020744 with English translation.
KR Office Action dated Nov. 1, 2022, in Application No. 10-2017-0172906 with English translation.
KR Office Action dated Nov. 17, 2022, in Application No. KR10-2016-0042618 with English translation.
KR Office Action dated Nov. 26, 2022, in Application No. KR1020220020744 with English translation.
KR Office Action dated Oct. 16, 2023, in Application No. KR10-2023-0032580 with English translation.
KR Office Action dated Oct. 20, 2023, in Application No. KR10-2016-0042618 with English Translation.
KR Office Action dated Oct. 24, 2022, in Application No. KR10-2014-0165420 with English Translation.
KR Office Action dated Oct. 30, 2023, in Application No. KR 10-2023-0131625 with English translation.
Sobbia, R., et al., "Uniformity Study in Large-area Showerhead Reactors," Journal of Vacuum Science and Technology, 2005, vol. 23(4), pp. 927-932.
TW Office Action dated Apr. 10, 2023 in Application No. TW108137228 with English translation.
TW Office Action dated Jun. 28, 2023 in Application No. TW111120546 with English translation.

(56) References Cited

OTHER PUBLICATIONS

U.S Advisory Action dated Mar. 20, 2023 in U.S. Appl. No. 17/649,020.
U.S. Final Office Action dated Dec. 6, 2022 in U.S. Appl. No. 17/649,020.
U.S. Final Office Action dated Feb. 1, 2023 in U.S. Appl. No. 16/770,526.
U.S. Final Office Action dated Oct. 20, 2023 in U.S. Appl. No. 17/309,032.
U.S. Non Final Office Action dated Mar. 30, 2023 for U.S. Appl. No. 17/309,032.
U.S. Non-Final Office Action dated Jun. 26, 2023, in U.S. Appl. No. 17/649,020.
U.S. Non-Final Office Action dated Sep. 12, 2023, in U.S. Appl. No. 17/930,397.
U.S. Notice of Allowance dated Aug. 16, 2023 in U.S. Appl. No. 16/770,526.
U.S. Notice of Allowance dated May 9, 2023 in U.S. Appl. No. 16/770,526.
U.S. Notice of Allowance dated Nov. 1, 2023, in U.S. Appl. No. 17/649,020.
U.S. Appl. No. 18/447,199, inventors Lai F, et al., filed Aug. 9, 2023.
Xia, H., et al., "Experimental Study of the Effects of Showerhead Configuration on Large-area Silicon-nitride Thin Film by Plas1na-enhanced Chemical Vapor Deposition," Thin Solid Films, 2017, vol. 638, pp. 1-8.
Zhao, A., et al., "Improvement of Film Uniformity Stability of PECVD Silicon Nitride Deposition Process by Addition of Fluorine Removal to the Plasma Clean Sequence," IEEE/SEMI Conference and Workshop on Advanced Semiconductor Manufacturing, 2005, pp. 1-6.
JP Office Action dated Apr. 9, 2024 in JP Application No. 2021521275 with English Translation.
KR Office Action dated Feb. 22, 2024 in KR Application No. 10-2021-7014975 with English translation.
U.S. Final Office Action dated Apr. 9, 2024 in U.S. Appl. No. 17/930,397.
CN Office Action dated Aug. 21, 2024 in CN Application No. 202110637340.5 with English translation.
CN Office Action dated Jun. 13, 2024 in CN Application No. 201880079241.6 with English translation.
CN Office Action dated May 24, 2024 in CN Application No. 201880089300.8 with English translation.
CN Office Action dated May 29, 2024 in CN Application No. 201980084282.9 with English translation.
Kim Y.J., et al., "Effects of Showerhead Shapes on the Flowfields in a RF-PECVD Reactor," Surface and Coatings Technology, Apr. 1, 2005, vol. 193 (1-3), pp. 88-93.
KR Office Action dated Aug. 19, 2024 in KR Application No. 10-2020-7019522 with English Translation.
KR Office Action dated Jul. 24, 2024 in KR Application No. 10-2020-7020362, with English Translation.
U.S. Non-Final Office Action dated Jun. 21, 2024 in U.S. Appl. No. 18/447,199.
U.S. Non-Final Office Action dated Jun. 24, 2024 in U.S. Appl. No. 17/309,032.
U.S. Notice of Allowance dated Aug. 1, 2024 in U.S. Appl. No. 17/930,397.
CN Office Action dated Nov. 23, 2023 in CN Application No. 201880089300.8 with English translation.
KR Office Action dated Dec. 1, 2023 in KR Application No. 10-2020-7019522 with English Translation.
KR Office Action dated Feb. 22, 2024 in KR Application No. 10-2021-7014975.
KR Office Action dated Jan. 27, 2024 in KR Application No. 10-2016-0042618 with English translation.
KR Office Action dated Nov. 28, 2023 in KR Application No. 10-2016-0034431 with English Translation.
U.S. Advisory Action dated Jan. 29, 2024 in U.S. Appl. No. 17/309,032.
U.S. Notice of Allowance dated Feb. 7, 2024 in U.S. Appl. No. 17/649,020.
U.S. Notice of Allowance dated Jan. 19, 2024 in U.S. Appl. No. 17/649,020.
U.S. Appl. No. 18/427,691, inventor Varadarajan B, filed Jan. 30, 2024.
KR Office Action dated Oct. 10, 2024 in KR Application No. 10-2021-7014975 with English Translation.
KR Office Action dated Sep. 30, 2024 in KR Application No. 10-2023-0131625 with English Translation.
U.S. Advisory Action dated Dec. 9, 2024 in U.S. Appl. No. 17/309,032.
U.S. Final Office Action dated Dec. 4, 2024 in U.S. Appl. No. 18/447,199.
U.S. Final Office Action dated Oct. 1, 2024 in U.S. Appl. No. 17/309,032.
U.S. Supplemental Notice of Allowance dated Nov. 5, 2024 in U.S. Appl. No. 17/930,397.

\* cited by examiner

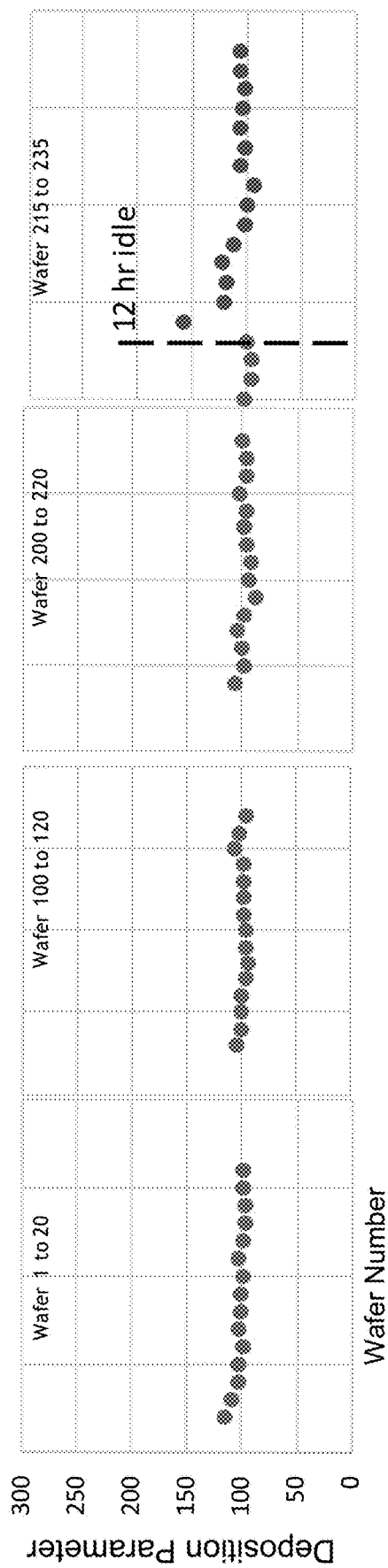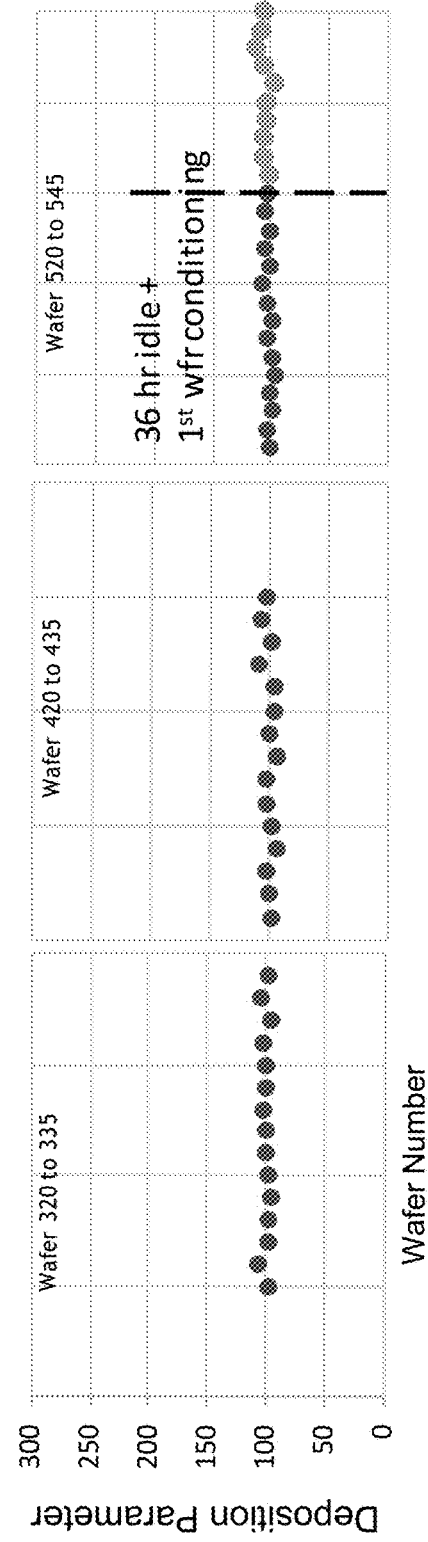

EX SITU COATING OF CHAMBER COMPONENTS FOR SEMICONDUCTOR PROCESSING

INCORPORATION BY REFERENCE

An Application Data Sheet is filed concurrently with this specification as part of the present application. Each application that the present application claims benefit of or priority to as identified in the concurrently filed Application Data Sheet is incorporated by reference herein in its entirety and for all purposes.

FIELD

Various embodiments herein relate to methods and apparatus for preparing chamber components for use in a semiconductor processing apparatus.

BACKGROUND

As the semiconductor industry advances, device dimensions are becoming increasingly smaller. These progressively smaller features require deposition procedures that are extremely uniform and repeatable, as the presence of film impurities or other non-uniformities can often lead to the failure of a semiconductor device.

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

Certain embodiments herein relate to methods of preparing chamber components for a reaction chamber used to process semiconductor substrates. In various embodiments, the methods involve providing the chamber component to a first reaction chamber and coating the chamber component with a protective coating using atomic layer deposition. After the protective coating is formed, the chamber component is removed from the first reaction chamber and installed in a second reaction chamber. The chamber component serves its intended purpose (e.g., as a showerhead, as a lift pin, as a lift pin retainer, as a substrate support pedestal, etc.) in the second reaction chamber as the second reaction chamber is used to process semiconductor wafers. In many cases the second reaction chamber is a vapor deposition apparatus such as an atomic layer deposition apparatus and/or a chemical vapor deposition apparatus.

In another aspect of the disclosed embodiments, a coated chamber component is provided. The chamber component may be coated ex situ with a protective coating deposited through atomic layer deposition as described herein. In another aspect of the disclosed embodiments, a reaction chamber is provided. The reaction chamber may have one or more chamber components coated ex situ with a protective coating deposited through atomic layer deposition as described herein.

In one aspect of the disclosed embodiments, a method of coating a chamber component for use in a second reaction chamber is provided, the method including: (a) receiving the chamber component as a substrate in a first reaction chamber; (b) providing a first reactant to the first reaction chamber and allowing the first reactant to adsorb onto a surface of the chamber component; (c) providing a second reactant to the first reaction chamber and reacting the first and second reactants with one another in an atomic layer deposition reaction to form a protective coating on the surface of the chamber component; (d) repeating (b) and (c) until the protective coating reaches a final thickness; and (e) removing the chamber component from the first reaction chamber.

In some embodiments, the protective coating includes a metal oxide, a metal nitride, or a metal fluoride. For instance, the metal in the metal oxide, metal nitride, or metal fluoride may be a transition metal. In some cases, the protective coating includes aluminum oxide, aluminum fluoride, or aluminum nitride. In some cases, the protective coating includes yttrium oxide or yttrium fluoride.

The method may further include installing the chamber component in the second reaction chamber after (e). In some such cases, the method may further include processing a semiconductor wafer in the second reaction chamber after installing the chamber component therein. Processing the semiconductor wafer may include depositing a film on the semiconductor wafer. The film may be deposited through atomic layer deposition or chemical vapor deposition in certain cases. In some embodiments, the method may further include establishing an elevated temperature in the second reaction chamber while depositing the film on the semiconductor wafer, the elevated temperature being between about 40-200° C.

In some implementations, the method may further include exposing the second reaction chamber to a restoration plasma while the chamber component is installed therein, where either: (a) the protective coating includes a metal oxide and the restoration plasma includes an oxidizing plasma, (b) the protective coating includes a metal nitride and the restoration plasma includes nitrogen, or (c) the protective coating includes a metal fluoride and the restoration plasma includes fluorine. The restoration plasma may further include a metal that is the same as a metal in the protective coating.

In certain cases, the method may further include after depositing the film on the semiconductor wafer in the second reaction chamber, removing the semiconductor wafer from the second reaction chamber, and exposing the second reaction chamber to a first plasma including oxygen, then exposing the second reaction chamber to a second plasma including nitrogen. In these or other embodiments, the method may further include cleaning the second reaction chamber by exposing the second reaction chamber to a fluorine-containing plasma, then removing fluorine from the second reaction chamber by exposing the second reaction chamber to a reducing plasma.

The protective coating may form without exposing the chamber component to plasma in certain cases. In other cases, the protective coating forms as a result of exposure to plasma. In some embodiments, a plurality of chamber components are provided to the reaction chamber simultaneously, the plurality of chamber components including the chamber component, such that the protective coating forms on the plurality of chamber components simultaneously. In some such embodiments, the plurality of chamber components have a uniform size and shape. The plurality of chamber components processed simultaneously may then be serially installed in the second reaction chamber, one after another as they wear out or degrade over time. In other cases, the plurality of chamber components processed simultaneously may be delivered to a plurality of different second reaction chambers. In some embodiments, the plurality of chamber components have a uniform size and shape. In other embodiments, the plurality of chamber components do not have a uniform size and/or shape. In a particular embodiment, the plurality of chamber components do not have a uniform size and/or shape, and include a first chamber component and a second chamber component, the method further including installing the first and second chamber components in the second reaction chamber such that they are simultaneously present within the second reaction chamber.

In some embodiments, the method may further include removing excess first reactant from the first reaction chamber after (b) and before (c). Similarly, the method may further include removing excess second reactant from the first reaction chamber after (c) and before a subsequent iteration of (b). The final thickness of the protective coating may be between about 1 nm and 10 mm. In some cases, the final thickness is between about 100-800 nm, or between about 100-500 nm. In these or other cases, the method may further include processing a plurality of semiconductor wafers in the second reaction chamber after installing the chamber component therein, the plurality of semiconductor wafers being processed at different times.

In certain implementations, the method may further include masking a portion of the chamber component before (b) to prevent the protective coating from forming on the portion of the chamber component that is masked. In these or other embodiments, the method may further include positioning the chamber component on a substrate support within the first reaction chamber, such that one or more surfaces of the chamber component where the protective coating is desired are substantially exposed. The method may further include re-positioning the chamber component within the first reaction chamber from a first position to a second position, where the protective coating forms over a first set of features of the chamber component when oriented in the first position, and forms over a second set of surfaces of the chamber component when oriented in the second position.

The chamber component may be a showerhead in various embodiments. In some cases, the method may be repeated with a second chamber component that is a nozzle, and the method may further include attaching the nozzle to the showerhead after both the showerhead and nozzle are coated with the protective coating. The showerhead may include a first set of holes that extend through a thickness of the showerhead. The protective coating may conformally coat the first set of holes. The showerhead may include a second set of holes that connect with one or more internal passages within the showerhead. The protective coating may conformally coat the first set of holes, the second set of holes, and the internal passages. In certain implementations, the chamber component is a substrate support pedestal. In certain implementations, the chamber component is a lift pin, a lift pin retainer, or a gas line delivery component. The protective coating may be formed at a temperature between about 20-650° C. in some cases.

In another aspect of the disclosed embodiments, a method of operating a reaction chamber to deposit film on semiconductor wafers while achieving a particular degree of process non-uniformity is provided, the method including: (a) depositing the film on each semiconductor wafer in a batch, each film having an average film thickness, where the batch includes all semiconductor wafers processed in the reaction chamber between subsequent cleaning cycles, and where at least some of the semiconductor wafers in the batch are processed serially; and (b) repeating (a) to deposit the film on each semiconductor wafer in at least nine additional batches for a total of at least ten batches, where the reaction chamber includes at least one chamber component having a protective coating formed thereon, where the protective coating was formed through an atomic layer deposition reaction performed outside the reaction chamber, where an on-wafer non-uniformity of the film varies by no more than about 3% of the average film thickness when comparing films deposited on semiconductor wafers from a first batch and a last batch of the at least ten batches.

In certain embodiments, the batches include at least about 50 semiconductor wafers. For instance, the batches may include at least about 200 semiconductor wafers. The average film thickness may be at least about 50 Å thick. For instance, the average film thickness may be at least about 200 Å thick.

In some implementations, (b) may include repeating (a) to deposit the film on each semiconductor wafer in at least 19 additional batches for a total of at least 20 batches, where the on-wafer uniformity of the film varies by no more than about 1% of the average film thickness when comparing films deposited on semiconductor wafers from a first batch and a last batch of the at least 20 batches. In these or other embodiments, the batches may include at least about 50 semiconductor wafers, and (b) may include repeating (a) to deposit the film on each semiconductor wafer in at least 19 additional batches for a total of at least 20 batches, where the on-wafer uniformity of the film varies by no more than about 0.05% of the average film thickness when comparing films deposited on semiconductor wafers from a first batch and a last batch of the at least 20 batches.

These and other features will be described below with reference to the associated drawings.

in on-wafer non-uniformity achieved over time in a case where the relevant chamber components were coated with a protective coating according to the embodiments herein, and in another case where the relevant chamber components were uncoated.

Figure 9:
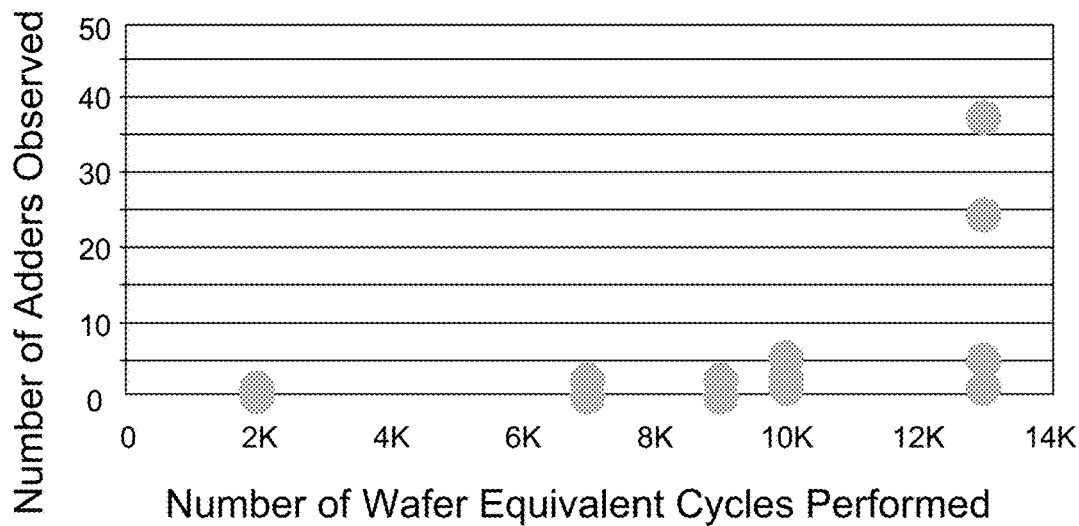

FIG. 9 is a graph describing the number of particles observed on certain semiconductor substrates processed in a reaction chamber having a showerhead coated with a protective coating according to certain embodiments.

Figure 10A:
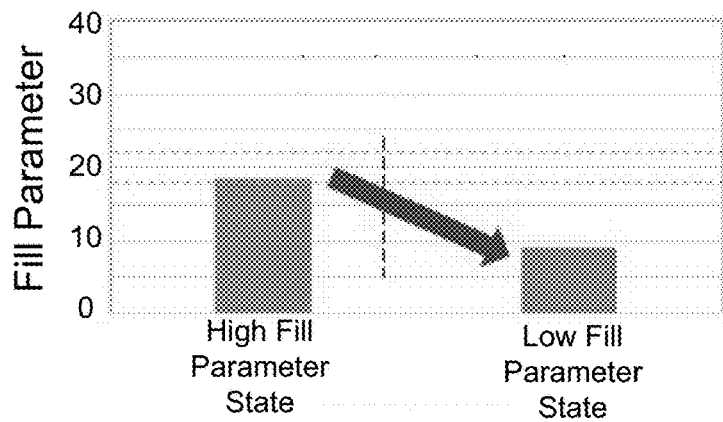
Figure 10B:
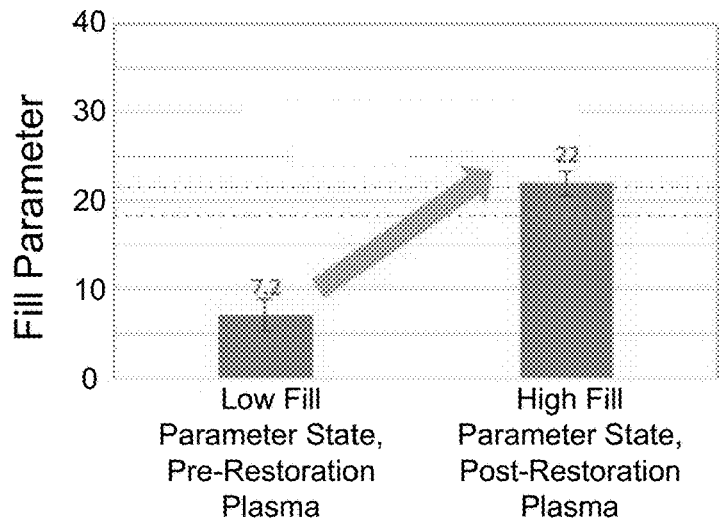

FIGS. 10A and 10B describe a high fill parameter state and a low fill parameter state for a reaction chamber according to certain embodiments.

Figure 11A:
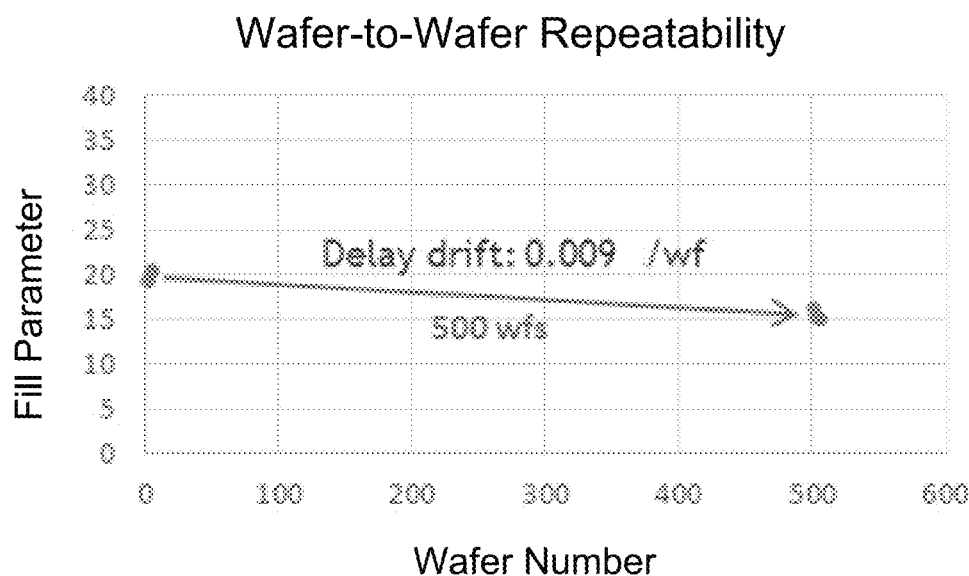
Figure 11B:
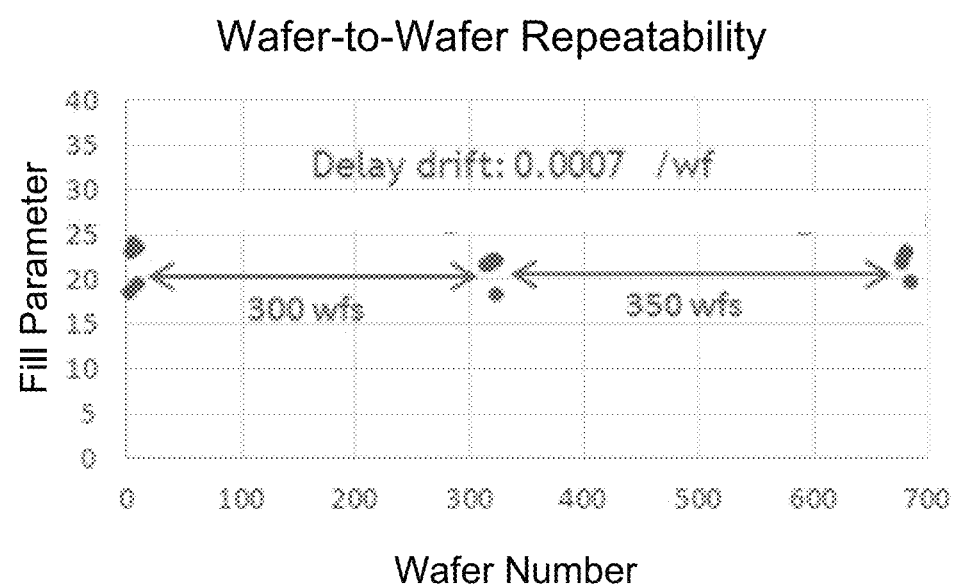

FIGS. 11A and 11B illustrate the drifting in fill parameter time over the course of processing several hundred semiconductor wafers in a case where a nitrogen plasma was provided to the reaction chamber after each semiconductor wafer was processed (FIG. 11A), and in a case where an oxygen plasma, followed by a nitrogen plasma, was provided to the reaction chamber after each semiconductor wafer was processed (FIG. 11B).

Figure 12A:
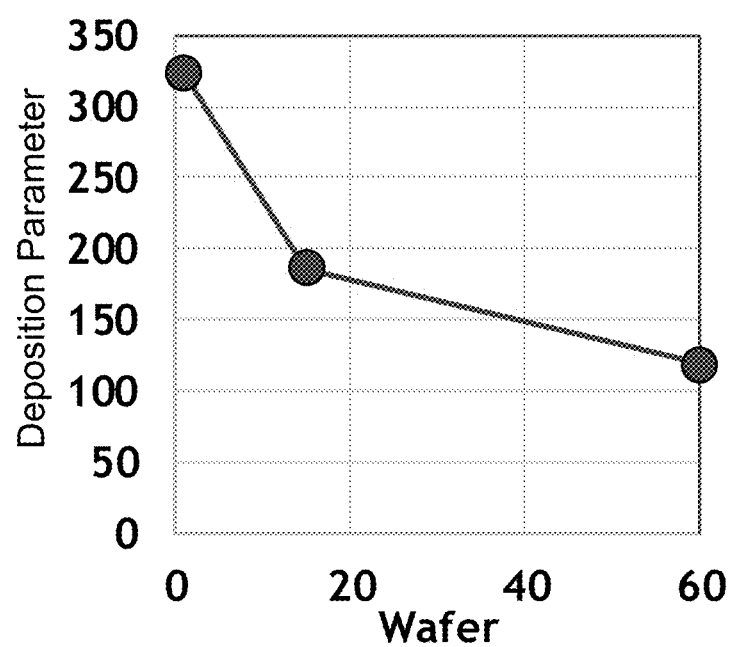

FIG. 12A shows the non-uniform deposition parameter achieved for various wafers processed over time in a reaction chamber having a cooled showerhead therein.

FIGS. 12B-12H show the much more uniform deposition parameter achieved for various wafers processed over time in a reaction chamber having a heated showerhead therein.

DETAILED DESCRIPTION

In this application, the terms "semiconductor wafer," "wafer," "substrate," "wafer substrate," and "partially fabricated integrated circuit" are sometimes used interchangeably. However, it is understood that the term "substrate" may refer to a semiconductor wafer, or it may refer to a chamber component that is being processed in a different reaction chamber. The term "wafer" is intended to refer exclusively to a semiconductor wafer, as generally understood. One of ordinary skill in the art would understand that the term "partially fabricated integrated circuit" can refer to a silicon wafer during any of many stages of integrated circuit fabrication thereon. A wafer or substrate used in the semiconductor device industry typically has a diameter of 200 mm, or 300 mm, or 450 mm. The following detailed description assumes that some of the embodiments are implemented on a wafer. However, the embodiments are not so limited. The work piece may be of various shapes, sizes, and materials. In various embodiments, the work piece is a chamber component, as described below. The chamber component may be incorporated into a different reaction chamber after it is processed as a substrate/work piece in a first reaction chamber. In addition to semiconductor wafers, other work pieces that may take advantage of the disclosed embodiments include various articles such as printed circuit boards, magnetic recording media, magnetic recording sensors, mirrors, optical elements, micro-mechanical devices and the like (as well as any chamber components for reaction chambers used to fabricate such articles).

When fabricating semiconductor devices, it is advantageous for the fabrication process to be precise and repeatable. Such precision and repeatability reduce manufacturing costs by minimizing the number of devices that are not within a desired specification. Unfortunately, as a semiconductor fabrication apparatus processes additional wafers over time, the processing conditions within the apparatus change. These changing conditions can have an effect on the wafers processed within the apparatus. For example, as a reaction chamber is used to deposit film on a series of wafers over time, film byproducts build up on internal surfaces of the reaction chamber. After a period of time, the reaction chamber is cleaned to remove the film byproducts. In many cases, this cleaning process involves exposing the reaction chamber to a remotely generated plasma (e.g., a fluorine containing plasma such as nitrogen fluoride plasma) to thereby remove the film byproducts. Unfortunately, this cleaning process can alter the surface conditions of the underlying reaction chamber components. For instance, an aluminum showerhead and/or substrate support pedestal can be attacked by fluorine radicals to form porous aluminum fluoride. This reaction significantly increases the surface area of the showerhead/pedestal, thereby changing the surface properties of these reactor components. Each time the reaction chamber is cleaned, the surface conditions of the chamber components are further altered. These changing surface conditions can result in changing deposition (or other processing) results for wafers processed in the reaction chamber over time. Experimental results illustrating these effects are discussed with relation to FIGS. 8A and 8B. It is noted that these changes can occur even if the showerhead is coated with an in situ formed undercoat, discussed further below.

Certain processes are particularly sensitive to the surface conditions of the chamber components such as the showerhead and pedestal. For example, chemical vapor deposition of silicon carbide ($SiC_x$) and its derivatives (e.g., which may include elements other than silicon and carbon) may be sensitive to these conditions. In various embodiments, this process involves exposing a wafer to hydrogen radicals, which may or may not be generated remotely from the reaction chamber. Without being bound to theory or mechanism of action, it is believed that the generation and distribution of hydrogen radicals to the semiconductor wafer is affected by the surface conditions of chamber components such as the showerhead and pedestal. As additional chamber cleans are performed over time, the surface conditions of these components changes (e.g., becoming further attacked by fluorine radicals, thereby providing increasing surface area), and the deposition results drift over time.

The wafers that are processed in a particular reaction chamber in between subsequent chamber cleaning operations are referred to as a batch. The wafers in a batch are processed serially over time. In other words, the batch processing described herein is different from batch processing where all substrates in the batch are processed simultaneously. In the batch processing used herein, at least some of the substrates within the batch are processed at different times. However, it is understood that certain reaction chambers are configured to process multiple substrates simultaneously, and that in such cases, certain substrates within a batch can be processed simultaneously. In one example, a freshly cleaned reaction chamber is used to deposit film on one wafer at a time, and the reaction chamber is cleaned after 200 wafers are processed. In this example, the batch includes the 200 wafers that were processed between subsequent chamber cleans. In another example, a freshly cleaned reaction chamber is used to deposit film on two wafers at a time, and the reaction chamber is cleaned after 400 wafers are processed. In this example, the batch includes the 400 wafers that were processed between subsequent chamber cleans.

In some cases, a batch of wafers includes at least about 25 wafers, at least about 50 wafers, at least about 100 wafers, or at least about 200 wafers. In these or other cases, a batch of wafers may include up to about 400 wafers, or up to about 200 wafers. In various embodiments, the batch may include between about 200-400 wafers, though many batch sizes may be used. An ideal batch size may depend on a number of factors including, but not limited to, the composition of film being deposited (or otherwise processed), the thickness of film being deposited (or otherwise processed), etc.

Another issue that can arise during semiconductor device fabrication is the generation of particles that contaminate a partially fabricated semiconductor device. Often, the particles are metallic particles that originate from internal surfaces in the reaction chamber itself. For example, the particles may originate from internal chamber walls, ceiling, showerhead, substrate support, lift pins, gas lines, nozzles, etc. In a particular example, the reaction chamber and/or components therein are made of aluminum, for example aluminum 6061-T6 (which may include aluminum and small amounts of other materials such as chromium, copper, iron, magnesium, manganese, silicon, titanium, zinc, etc). In many cases, the particles are generated as the reaction chamber is exposed to plasma or other harsh processing conditions. The particles may fall onto the surface of a substrate during processing, thereby causing undesirable film impurities and increasing the likelihood of device failure.

One technique to combat such particle generation is to coat the surfaces of the reaction chamber in an undercoat. An undercoat is a layer of material that is formed in situ on internal chamber surfaces to minimize metallic contamination from the bare chamber surfaces. Typically, an undercoat is deposited while there is no substrate present in the reaction chamber. The undercoat forms on internal chamber surfaces that are exposed to the both (a) the reactants that form the undercoat, and (b) the energy to drive the reaction between the reactants. Undercoats are further described in U.S. application Ser. No. 14/089,653, filed Nov. 25, 2013, and titled "CHAMBER UNDERCOAT PREPARATION METHOD FOR LOW TEMPERATURE ALD FILMS," which is herein incorporated by reference in its entirety.

While undercoats are useful in reducing particle generation and the related contamination, undercoats also present certain challenges. For example, as mentioned above, the undercoat only forms on chamber surfaces that are exposed to both the relevant reactants and the energy to drive the appropriate reaction. The result is that the undercoat often provides incomplete coverage on the relevant surfaces. As used herein, a surface of a chamber component is a "relevant surface" if it is intended/desirable for the coating to form on that surface. Surfaces which are intentionally masked to prevent deposition thereon are excluded from the meaning of "relevant surface" unless otherwise indicated. Surfaces/components that frequently receive incomplete undercoat coverage from an in situ deposited undercoat include, but are not limited to, (1) internal surfaces of showerhead holes, (2) a back surface of the showerhead, (3) a stem of the showerhead, (4) internal surfaces of gas and/or plasma delivery lines, nozzles, valves, etc., (5) a lift pin, (6) a lift pin holder/retainer, (7) an aluminum or other metal pedestal on which the wafer is placed, etc.

It can be difficult or impossible to expose many of these surfaces to the relevant reactants and energy in situ within the reaction chamber, for example as a result of the geometry of the reaction chamber and/or the positioning of the components within the reaction chamber. Certain surfaces may not be exposed to all of the relevant reactants, for example gas delivery lines and showerhead holes that are configured to deliver only a single reactant may never be exposed to a second reactant needed for film formation. Similarly, these or other surfaces may not be exposed to the energy that drives the reaction that forms the undercoat. For instance, in cases where the undercoat forms as a result of exposure to thermal energy, some of the listed surfaces may not be heated to an appropriate temperature. In cases where the undercoat forms as a result of exposure to plasma energy, some of the listed surfaces may not be exposed to plasma. In some cases, the plasma may not be able to penetrate into small spaces (e.g., inside showerhead holes and gas delivery lines) due to plasma-specific considerations such as the thickness of the plasma sheath. Conventional coating techniques have not been able to coat the inside of showerhead holes. For instance, physical vapor deposition, thermal spray, and other line of sight coating technologies are frequently unable to coat showerhead holes having aspect ratios greater than about 10. These uncoated holes can be attacked when exposed to a reducing plasma (e.g., ammonia plasma, $H_2$ plasma, etc.), fluorine-containing plasma (e.g., $NF_3$ plasma), and/or oxidizing plasma (e.g., $N_2O$ plasma, $O_2$ plasma, $CO_2$ plasma, etc.), especially at elevated temperatures. Such attack can change the hole dimensions, surface finish, or other characteristics of the holes, which may cause the gas flow and/or plasma to behave differently over time as the holes are attacked and changed. The changes in the showerhead holes impact the uniformity of the gas flow and plasma, thereby negatively impacting film non-uniformity on wafers placed and processed inside the chamber, as discussed further below in relation to FIG. 8A. Such changes have a significant effect on the useful lifetime of the showerhead.

Moreover, in situ deposited undercoats (and other chamber component coating processes such as anodization, sputtering, physical vapor deposition, and plasma spray, which may or may not be performed in situ) result in a microporous material deposited on the chamber surfaces. The microporous structure of this material results in substantial radical losses when exposed to plasma. Such radical losses prevent the semiconductor wafer from being properly processed, as the radicals are effectively consumed before they are able to reach the wafer where they are needed. Another issue with conventional coating techniques is that they typically form relatively thick coatings (e.g., greater than 500 nm), and have a tendency to undesirably flake off of the chamber component and onto a semiconductor wafer.

The techniques described herein provide the benefits that arise from coated chamber surfaces while overcoming several challenges related to in situ deposition of an undercoat. Generally speaking, the techniques described herein involve forming a protective coating on one or more components positioned in a first reaction chamber, where the components are later installed in a second reaction chamber. The first reaction chamber is used to prepare/coat the relevant chamber components, which are then removed and installed in the second reaction chamber, which is used to process semiconductor substrates. This ex situ deposition of the protective coating may ensure that all of the relevant surfaces of the chamber components are adequately coated, thereby minimizing particle generation and substrate contamination.

As used herein, a protective coating deposited on a chamber component is considered to be deposited "ex situ" where the protective coating is deposited on the chamber component in a first reaction chamber and then removed and installed in a second reaction chamber. Generally speaking, the chamber component is installed in and forms a part of the second reaction chamber. In other words, the chamber component serves its intended purpose (e.g., as a showerhead, lift pin, etc.) when installed in the second reaction chamber. Conversely, the chamber component is merely a substrate being coated when it is in the first reaction chamber. Because the chamber component is merely a substrate in the first reaction chamber, it can be positioned and manipulated as desired during deposition of the protective coating. This allows the protective coating to form on all relevant surfaces, which is not possible with in situ deposition of an undercoat.

The ex situ chamber component coating processes described herein are also beneficial in terms of maximizing throughput and reducing cost. In many cases, the protective coating is formed through an atomic layer deposition (ALD) process that cyclically builds film thickness on a layer-by-layer basis. While this technique forms a high quality, highly conformal protective coating, it takes a substantial amount of time to form the coating to a desired thickness (e.g., 1 nm-10 mm, in some cases between about 100-500 nm). In various cases, it takes on the order of one to several days to form the protective coating. If the protective coating is formed in situ as an undercoat on a reactor used to process semiconductor wafers, this renders the reactor unavailable for processing semiconductor wafers during the entire time that the protective coating is being formed. This downtime reduces throughput and increases cost.

By contrast, when the chamber components are coated ex situ, the reactor remains available to process semiconductor substrates while the chamber components are being coated in a different reactor. Often, the chamber components that are coated using the techniques described herein are components that wear out after a period of use. These consumable parts are installed in a reaction chamber and used for a period of time before being replaced. As such, a reaction chamber used to process semiconductor wafers may continue to use a first showerhead while a second showerhead is being coated with a protective coating in a different reaction chamber. It is understood that these processes may or may not occur simultaneously. After the second showerhead is coated, the first showerhead is uninstalled and the second showerhead is swapped in. The showerhead removal and reinstallation process is significantly faster than the process for forming the protective coating (at least in cases where the protective coating is deposited through atomic layer deposition to a thickness recited herein). Moreover, because the ex situ coating process forms a more complete protective coating on the relevant surfaces of the chamber components, the protective coating may provide superior protection, and may last longer compared to an in situ deposited undercoat. This means that the chamber components need to be replaced less frequently, thereby minimizing the cost of owning and operating the processing apparatus.

Coating Process

In various embodiments, the protective coating is deposited through atomic layer deposition. In some cases, plasma-assisted atomic layer deposition may be used. As used herein, the term "atomic layer deposition" is intended to include plasma-assisted atomic layer deposition, unless otherwise specified. When applied to an atomic layer deposition process, the term "thermal" means that the reaction is driven by thermal energy, rather than plasma energy.

Protective coatings that are formed ex situ through atomic layer deposition methods as described herein tend to be denser than coatings formed through the conventional methods described above. These dense coatings do not have a porous microstructure, and therefore promote a substantially lower rate of radical recombination, thereby ensuring that a much higher proportion of radicals are able to reach the semiconductor wafer, where they are needed. Issues related to radical recombination in the context of coated chamber components are further described in U.S. patent application Ser. No. 14/712,167, filed Mar. 26, 2015, and titled "MINIMIZING RADICAL RECOMBINATION USING ALD SILICON OXIDE SURFACE COATING WITH INTERMITTENT RESTORATION PLASMA," which is herein incorporated by reference in its entirety. As compared with the embodiments in the referenced application, the coatings described herein are expected to form denser materials with improved microstructure.

Figure 1A:
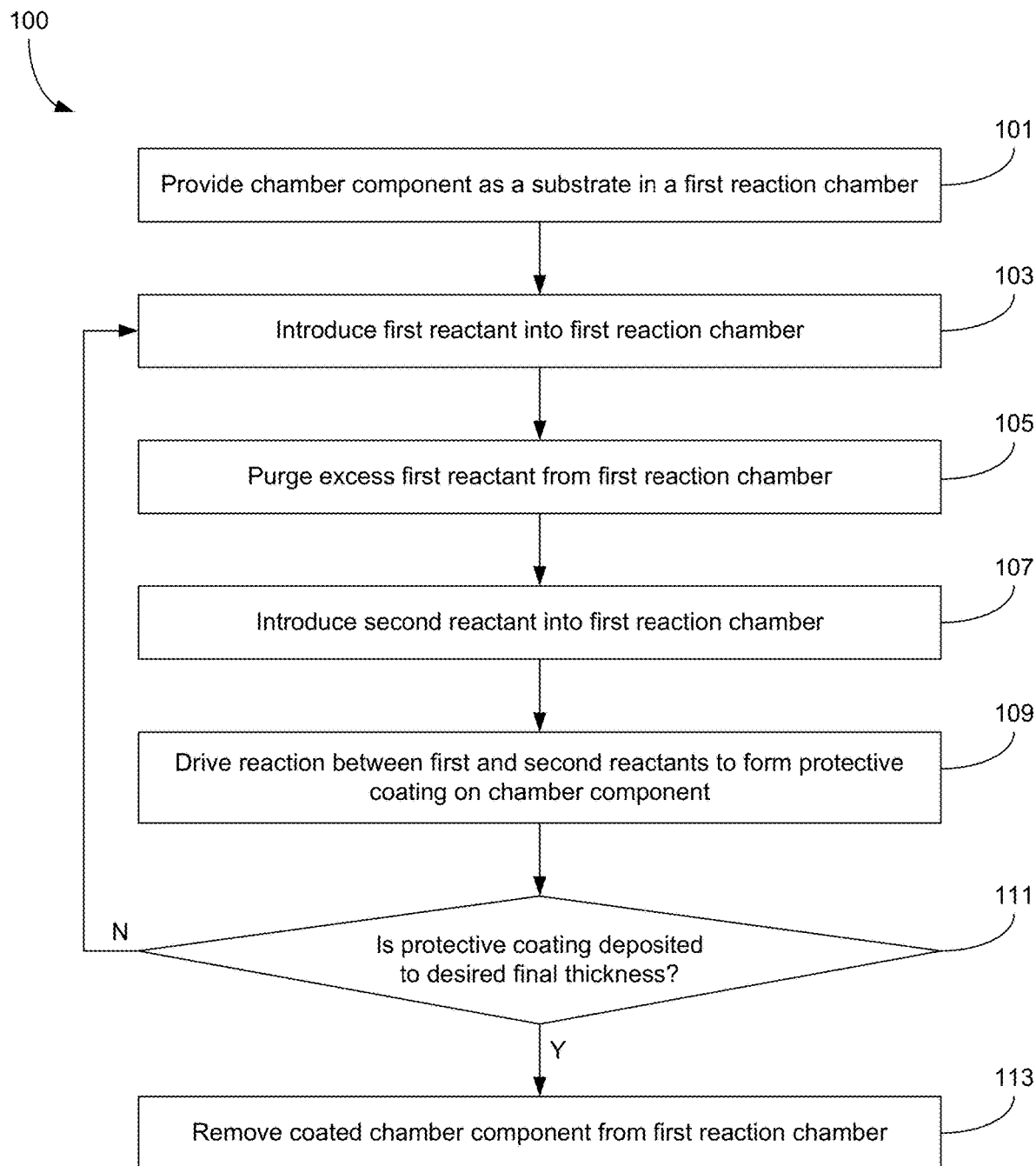
FIG. 1A is a flow chart describing a method of forming a protective coating over a chamber component, where the protective coating is formed ex situ through atomic layer deposition.

FIG. 1A illustrates a flow chart describing a method 100 of forming a protective coating on a chamber component according to various embodiments. The method 100 begins with operation 101, where the chamber component is provided as a substrate to a first reaction chamber. The chamber component is placed within the first reaction chamber, but it is not installed therein as a component of the first reactor. In other words, if the chamber component is a showerhead, the showerhead does not function as a showerhead when it is present in the first reaction chamber. The showerhead may be provided by itself, without connection to gas lines or other components. The chamber component may be positioned on a substrate support. The substrate support may be configured to expose all relevant surfaces of the chamber component on which the protective coating is desired to form. In some cases, the chamber component may be moved/repositioned within the first reaction chamber during deposition of the protective coating to ensure that all relevant surfaces are coated. In some cases, the chamber component may be disassembled or otherwise opened to expose additional surfaces for coating.

Masking may be provided as needed to shield surfaces where the protective coating is not desired. Such masking is required to prevent the ALD coating from being deposited on areas requiring electrical contacts or other electrical properties associated with metals. Masking can also be done at gas entry or exit holes to prevent the coating from being deposited inside certain channels in a showerhead that may be cooled by water or other fluids. Such multi-plenum showerheads are increasing utilized in state of the art deposition chambers. The proposed techniques would therefore be able to selectively coat such complex parts in areas that provide maximum benefits for enhancing part lifetime while meeting wafer requirements.

In various embodiments, the chamber component may be the only substrate in the first reaction chamber. In other embodiments, a plurality of chamber components may be provided to the first reaction chamber simultaneously, each chamber component acting merely as a substrate being coated in the first reaction chamber. In some cases, the chamber components that are simultaneously coated in the first reaction chamber may all be installed together in the same second reaction chamber. For example, any of the chamber components listed herein may be coated simultaneously in a first reaction chamber and then installed together in the same second reaction chamber. In a particular example, both a showerhead and lift pins are simultaneously coated in a first reaction chamber and later installed in the same second reaction chamber. This simultaneous coating on different types of chamber components can ensure that the different chamber components all have a uniform protective coating thereon. In some other examples, a plurality of chamber components are coated simultaneously in a first reaction chamber, where the plurality of chamber components includes only one type of component (e.g., a showerhead, or a lift pin, or gas delivery line, etc.). In one example, a plurality of similar or identical showerheads are simultaneously coated in the first reaction chamber. This simultaneous coating on similar or identical types of chamber components can help minimize variability in the coating from one chamber component to the next within a particular type of chamber component. This may be particularly useful in reducing non-uniformities that arise when replacing an old chamber component with a new one.

At operation 103 a first reactant is introduced into the first reaction chamber. The first reactant adsorbs onto all exposed surfaces of the chamber component. Example dose times for the first reactant may be between about 1 and 30 seconds. At operation 105, any excess first reactant is purged from the first reaction chamber. Such purging may be accomplished by evacuating the first reaction chamber and/or sweeping the first reaction chamber with another gas (e.g., an inert gas in many cases). Purging the first reactant from the first reaction chamber minimizes the risk of an unwanted gas phase reaction between the first reactant and a second reactant. Such purging may not be necessary (and may therefore be omitted) in certain cases where the reaction is driven by plasma.

At operation 107 the second reactant is introduced to the first reaction chamber. The second reactant may adsorb onto exposed surfaces of the chamber component. Example dose times for the second reactant may be between about 1 and 30 seconds. At operation 109, a reaction is driven between the first and second reactants to form the protective film on the chamber component. In many cases the reaction between the first and second reactants is a thermally driven atomic layer deposition reaction. In such cases, operation 109 may involve ensuring that the first reaction chamber (or a component therein such as a substrate support) reaches or maintains a target temperature. The target temperature may depend on the reactants provided to the reaction chamber, the desired composition of the protective coating, and the eventual use for the coated chamber component (e.g., the deposition may occur at a temperature near a typical or maximum processing temperature to which the chamber component will be exposed when installed in a reaction chamber used to process semiconductor wafers). In some examples, the target temperature may be between about 150-400° C., or between about 300-700° F. In other cases, the reaction between the first and second reactants is a plasma-assisted atomic layer deposition reaction. In such cases, operation 109 may involve generating plasma and exposing the chamber component to the plasma. The plasma may be any kind of plasma including an inductively coupled plasma, a capacitively coupled plasma, a microwave coupled plasma, a transformer coupled plasma, a remote plasma, an in situ plasma, etc. Example plasma exposure durations may be between about 0.5 seconds and 20 minutes. Example RF power levels for generating the plasma may be between about 0.5-3 kW. Example frequencies for generating the plasma include 400 kHz, 2 MHz, 13.6 MHz, and 60 MHz.

Without being limited by theory or mechanism of action, it is believed that thermally driven atomic layer deposition reactions (as opposed to plasma-assisted atomic layer deposition reactions) may be better at forming high quality, highly conformal protective films in small protected regions such as the interior of showerhead holes and the interior of gas delivery lines. As discussed above, plasma may not be able to penetrate such small protected regions, leaving them uncoated. Thermally driven reactions can better coat these regions, as it is relatively easy to deliver the needed thermal energy to all the relevant surfaces.

Operations 103, 105, 107, and 109 together describe one atomic layer deposition cycle. Each cycle builds up one monolayer of film thickness, with each monolayer having a thickness between about 0.5-3 Å. The thickness of each monolayer depends upon a number of factors including, e.g., the exposure time for each reactant dosing step, the sticking coefficients of the reactants, etc. Optionally, the first reaction chamber may be purged after operation 107 and before operation 109 and/or after operation 109 and before a subsequent iteration of operation 103. Such purges may help reduce unwanted gas phase reactions, and may help remove byproducts or other contaminants from the first reaction chamber.

At operation 111, it is determined whether the protective coating has reached a desired final thickness. In a number of embodiments herein, the desired final thickness is between about 1 nm and about 10 mm. In some cases the final thickness is about 1 nm or thicker, about 10 nm or thicker, about 100 nm or thicker, about 200 nm or thicker, about 500 nm or thicker, about 1 µm or thicker, about 10 µm or thicker, about 100 µm or thicker, about 500 µm or thicker, or about 1 mm or thicker. In these or other cases, the final thickness may be about 10 mm or less, about 1 mm or less, about 500 µm or less, about 100 µm or less, about 10 µm or less, about 1 µm or less, about 500 nm or less, about 200 nm or less, about 100 nm or less, or about 10 nm or less. Protective coatings in this thickness range may both (1) reduce contamination from underlying chamber surfaces, and (2) last a long time, even under harsh processing conditions. This thickness may allow for the chamber component to be repeatedly exposed to harsh plasma (e.g., a cleaning plasma, deposition plasma, treatment plasma, etc.) multiple times with minimal degradation. In some embodiments, at thicknesses above about 500 nm, the protective coating may tend to flake off more easily. In certain implementations, at thicknesses below about 100 nm, the protective coating may not provide as substantial or long-lasting protection against contamination.

In cases where the protective coating is not yet deposited to the desired final thickness, the method continues with operation 103, where another ALD cycle is started. In cases where the protective coating has reached the desired final thickness, the method continues with operation 113, where the coated chamber component is removed from the first reaction chamber. At this point, the coated chamber component is ready to be installed in a second reaction chamber, where it will serve its intended purpose. Because each ALD cycle deposits such a thin monolayer, it typically takes several hundreds or thousands of cycles to fully coat the chamber component to the final thickness. This typically takes about 1-3 days.

Figure 1B:
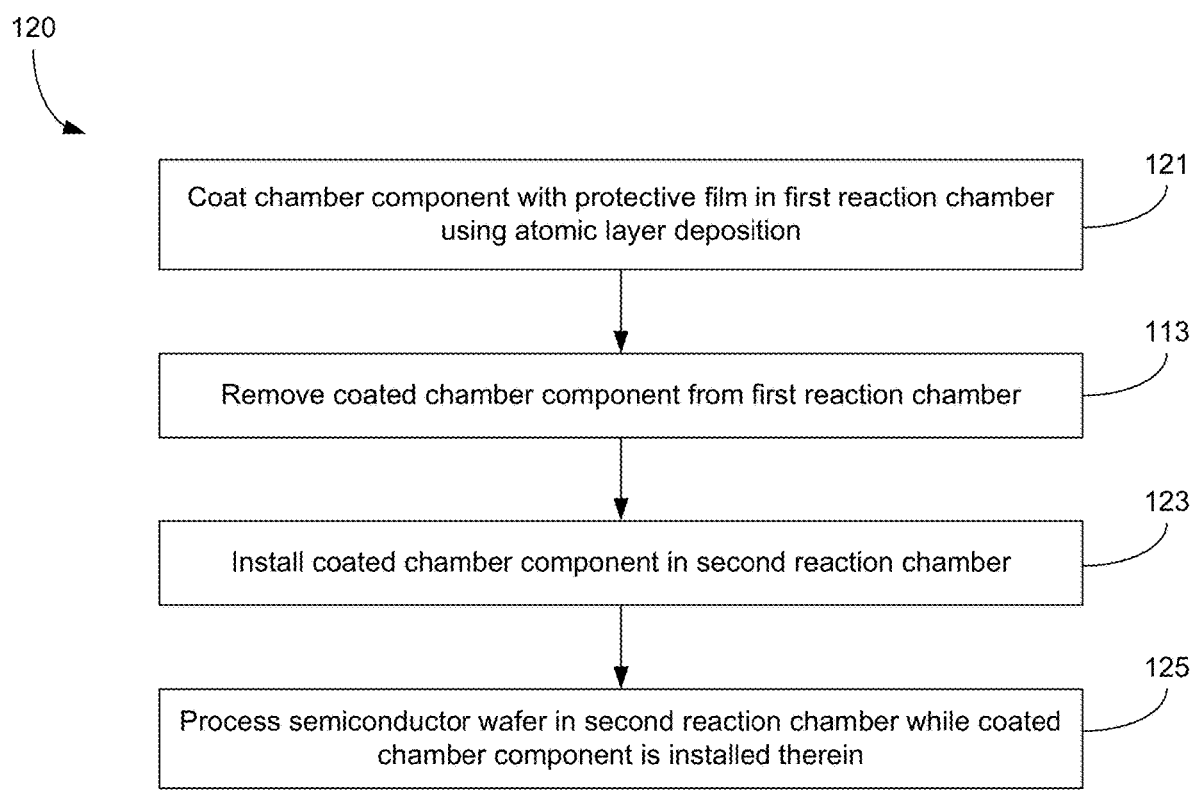
FIG. 1B is a flow chart describing a method preparing a reaction chamber and processing semiconductor wafers in the process chamber, where the preparation involves forming a protective coating on the chamber component using an ex situ atomic layer deposition method.

FIG. 1B presents a flow chart for a method 120 of preparing a second reaction chamber and processing semiconductor wafers therein. The method 120 begins at operation 121, where the chamber component is coated with a protective film in a first reaction chamber using atomic layer deposition. Operation 121 may be accomplished using operations 101-111 of FIG. 1A, for example. For the sake of brevity, the description will not be repeated. Next, the coated chamber component is removed from the first reaction chamber in operation 113. Operation 113 in FIG. 1B is the same as operation 113 in FIG. 1A. After the coated chamber component is removed from the first reaction chamber, it is installed in the second reaction chamber in operation 123. Next, at operation 125 a semiconductor wafer is processed in the second reaction chamber while the coated chamber component is installed therein. This processing may involve depositing a layer of film on the wafer, for example using atomic layer deposition, chemical vapor deposition, or another deposition method. In other cases, the processing may involve etching a material from the wafer, exposing the wafer to a plasma treatment, or another type of processing.

After a period of use, the coated chamber component (or the coating thereon) may begin to degrade, for example as a result of exposure to plasma (e.g., a fluorine-containing cleaning plasma). Typically, reaction chambers are periodically cleaned to remove material that builds up on internal chamber surfaces as a result of depositing material on semiconductor wafers. As an example where the reaction chamber is used for ALD, the reaction chamber may be cleaned after processing about 50 semiconductor wafers. In similar cases, the reaction chamber may be cleaned after processing about 100 semiconductor wafers, or after processing about 200 semiconductor wafers. The cleaning frequency depends on, e.g., the composition and thickness of the film being deposited on the semiconductor wafers. Generally speaking, thicker films require more frequent chamber cleaning.

The protective coating may be designed to withstand the cleaning process. In many cases, the protective coating is designed to withstand repeated exposure to a cleaning plasma. This helps ensure that the coated chamber component can be used for a relatively long time in the reaction chamber before it needs to be replaced. In various embodiments, the cleaning plasma is a nitrogen fluoride plasma. The nitrogen fluoride plasma includes fluorine radicals that react with materials (e.g., silicon-based materials, dielectric materials, and various other materials) that undesirably build up on internal chamber surfaces. Other fluorine-containing plasmas have a similar effect. Similarly, the protective coating may be designed to withstand exposure to ammonia plasma. The ammonia plasma may be used during deposition on a semiconductor wafer, for example to provide ammonia as a reactant. Ammonia plasma may also be used as a surface treatment on a semiconductor wafer.

Without being bound by theory or mechanism of action, it is believed that aluminum oxide ($Al_2O_3$), aluminum nitride (AlN), aluminum fluoride ($AlF_3$), aluminum oxynitride (AlON), yttrium oxide ($Y_2O_3$), and yttrium fluoride ($YF_3$) based protective coatings can withstand typical fluorine radical-based cleaning processes such as exposure to nitrogen fluoride plasma, as well as exposure to ammonia plasma. These materials are believed to exhibit substantially improved resistance to nitrogen fluoride plasma and ammonia plasma compared to, e.g., silicon oxide, which is commonly used as an undercoat material.

In some embodiments, two or more protective coatings of different compositions may be provided together. For instance, a protective coating may include a bilayer or trilayer comprising two or three sub-layers, respectively, each sub-layer having a composition listed herein. In some cases, four or more such sub-layers may be provided. Each sub-layer may have a thickness as described herein with respect to the entire protective film. In other cases, the entire protective film may have a thickness as described herein, with that thickness being divided between the different sub-layers. The sub-layers may have the same thickness in some cases. In other cases, the sub-layers may have different thicknesses. In a particular example, the protective film is a bilayer that includes aluminum oxide layered with yttrium oxide. Many other combinations are possible.

The resistance of the protective coating to degradation as a result of exposure to plasma may be enhanced by forming the protective coating at an elevated temperature, e.g., between about 75-700° C., in some cases between about 100-700° C., or between about 200-700° C., or between about 200-400° C., or between about 200-300° C., or between about 100-250° C., or between about 75-400° C., or between about 400-700° C. In some cases, a protective coating formed on an aluminum (or primarily aluminum) chamber component may be deposited at a temperature between about 75-400° C., or between about 100-250° C. or between about 200-400° C. In some other cases, a protective coating formed on a ceramic (or primarily ceramic) chamber component may be deposited at a temperature between about 400-700° C. Higher deposition temperatures may be used for coating ceramic components because the ceramic components may be subjected to higher processing temperatures after installation compared to the aluminum components. In any case, the protective coating may form at an elevated temperature that is within about 25° C., or within about 50° C., of the maximum temperature to which the chamber component will be exposed after the chamber component is coated and installed in a reaction chamber used to process semiconductor wafers. In some cases, a lower temperature may be used. In some cases, the deposition temperature may be as low as about room temperature (e.g., about 20° C.). In a particular embodiment, the protective coating may be formed at a temperature between about 20-650° C.

Within the elevated temperature range, any pores or trenches present on the surface of the chamber component expand. This allows the protective coating to form within the expanded pores and trenches, forming a conformal and complete protective coating. By contrast, if the chamber component is coated at a lower temperature, the pores or trenches do not expand, and the protective coating may not adequately form in such areas. Frequently, the chamber component will be exposed to elevated temperatures when installed in a second reaction chamber and used to process a semiconductor wafer. At this point, any pores/trenches will expand, and the incompletely coated regions within the pores/trenches will be vulnerable to particle generation. For these reasons, it is desirable to coat the chamber component at an elevated temperature. However, in various embodiments it is desirable to ensure that the deposition temperature for forming the protective coating is not too high. For example, in certain instances, protective coatings formed at higher temperatures (e.g., 400° C., 500° C., and above) exhibit poor particle performance when installed in a reaction chamber used to process semiconductor wafers. As such, in some cases the deposition temperature for forming the protective coating may be maintained below about 250° C., or below about 300° C., or below about 400° C. In many such cases, the deposition temperature is maintained above a minimum temperature of about 100° C. or 150° C.

A variety of reactants may be used to form the protective coating, depending on the composition of the desired coating. In many cases the protective coating is a metal oxide, a metal nitride, a metal fluoride, or a combination thereof. The metal in the protective coating may be a transition metal in various examples. Certain example reactants are listed below, though these are not intended to be limiting.

In cases where the protective coating includes aluminum (e.g., aluminum oxide, aluminum nitride, and/or aluminum fluoride), an aluminum-containing reactant may be used. Example aluminum-containing reactants include, but are not limited to, aluminum tris(2,2,6,6-tetramethyl-3,5-heptanedionate) ($Al(OCC(CH_3)_3CHCOC(CH_3)_3)_3$); triisobutylaluminum ([(CH$_3$)$_2$CHCH$_2$]$_3$Al); trimethylaluminum ((CH$_3$)$_3$Al); tris(dimethylamido)aluminum(III) (Al(N (CH$_3$)$_2$)$_3$), and mixtures thereof.

Where the protective coating includes yttrium (e.g., yttrium oxide, yttrium nitride, and/or yttrium fluoride), a yttrium-containing reactant may be used. Example yttrium-containing reactants include, but are not limited to, tris[N, N-bis(trimethylsilyl)amide]yttrium ([[(CH$_3$)$_3$Si]$_2$N]$_3$Y); tris (butylcyclopentadienyl)yttrium(III) (Y(C$_5$H$_4$CH$_2$ (CH$_2$)$_2$CH$_3$)$_3$); tris(cyclopentadienyl)yttrium(III) (Y(C$_5$H$_5$)$_3$); yttrium 2-methoxyethoxide solution, e.g., in 2-methoxyethanol (C$_9$H$_{21}$O$_6$Y); yttrium(III) tris(isopropoxide) (C$_9$H$_{21}$O$_3$Y); yttrium(III) tris(2,2,6,6-tetramethyl-3,5-heptanedionate) (Y(OCC(CH$_3$)$_3$CHCOC(CH$_3$)$_3$)$_3$), and mixtures thereof.

Where the protective coating includes titanium, (e.g., titanium oxide, titanium nitride, and/or titanium fluoride), a titanium-containing reactant may be used. Example titanium-containing reactants include, but are not limited to, tetrakis(diethylamido)titanium(IV) ([(C$_2$H$_5$)$_2$N]$_4$Ti); tetrakis(dimethylamido)titanium(IV) ([(CH$_3$)$_2$N]$_4$Ti); tetrakis (ethylmethylamido)titanium(IV) ([(CH$_3$C$_2$H$_5$)N]$_4$Ti); titanium(IV) diisopropoxidebis(2,2,6,6-tetramethyl-3,5-heptanedionate) (Ti[OCC(CH$_3$)$_3$CHCOC(CH$_3$)$_3$]$_2$(OC$_3$H$_7$)$_2$); titanium(IV) isopropoxide (Ti[OCH(CH$_3$)$_2$]$_4$); titanium tetrachloride (TiCl$_4$), and mixtures thereof.

Where the protective coating includes other metals, appropriate precursors can be provided as generally understood in the art.

Where the protective coating includes oxygen, an oxygen-containing reactant may be used. Example oxygen-containing reactants include, but are not limited to, oxygen (O$_2$), ozone (O$_3$), nitrous oxide (N$_2$O), nitric oxide (NO), nitrogen dioxide (NO$_2$), carbon monoxide (CO), carbon dioxide (CO$_2$), sulfur oxide (SO), sulfur dioxide (SO$_2$), oxygen-containing hydrocarbons (C$_x$H$_y$O$_z$), water (H$_2$O), mixtures thereof, etc.

Where the protective coating includes nitrogen, a nitrogen-containing reactant may be used. A nitrogen-containing reactant contains at least one nitrogen, for example, ammonia (NH$_3$), hydrazine, amines (e.g., amines bearing carbon) such as methylamine, dimethylamine, ethylamine, isopropylamine, t-butylamine, di-t-butylamine, cyclopropylamine, sec-butylamine, cyclobutylamine, isoamylamine, 2-methylbutan-2-amine, trimethylamine, diisopropylamine, diethylisopropylamine, di-t-butylhydrazine, as well as aromatic containing amines such as anilines, pyridines, and benzylamines. Amines may be primary, secondary, tertiary or quaternary (for example, tetraalkylammonium compounds). A nitrogen-containing reactant can contain heteroatoms other than nitrogen, for example, hydroxylamine, t-butyloxycarbonyl amine and N-t-butyl hydroxylamine are nitrogen-containing reactants.

Where the protective coating includes fluorine, a fluorine-containing reactant may be used. Example fluorine-containing reactants include, but are not limited to, hydrogen fluoride (HF) and metal fluorides such as titanium tetrafluoride (TiF$_4$); niobium(V) fluoride (NbF$_5$); tantalum pentafluoride (TaF$_5$); tungsten hexafluoride (WF$_6$); molybdenum fluoride (MoF$_x$); vanadium fluoride (VF$_x$), and mixtures thereof.

In a particular embodiment where the protective coating is aluminum oxide, the first reactant is trimethylaluminum and the second reactant is water. These reactants can react with one another as a result of exposure to thermal energy (e.g., no plasma exposure is required). As such, these reactants are particularly useful for forming a highly conformal protective coating over any non-masked surface of a chamber component, including recessed or otherwise difficult to access surfaces such as the interior of showerhead holes, interior plenums, etc.

Chamber Components that May be Coated

Any and all chamber components may be coated with the protective coating. Such components can include, but are not limited to, showerheads, gas delivery lines, lift pins, lift pin holders/retainers, chamber walls, chamber ceilings, substrate supports, pedestals, wafer carriers, etc. It may be particularly useful to provide the protective coating on chamber components that are replaced over time as they become degraded.

Figure 2A:
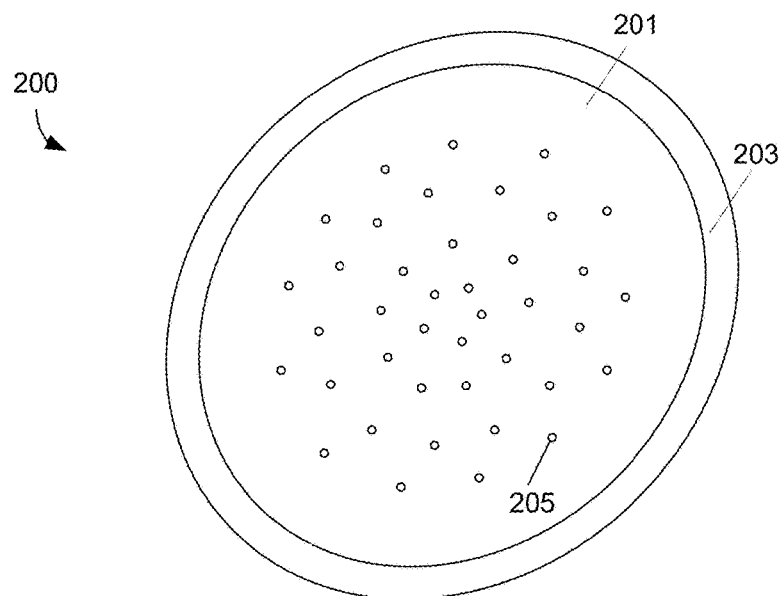
FIGS. 2A and 2B illustrate a showerhead that may be coated with a protective coating using the techniques described herein.
Figure 2B:
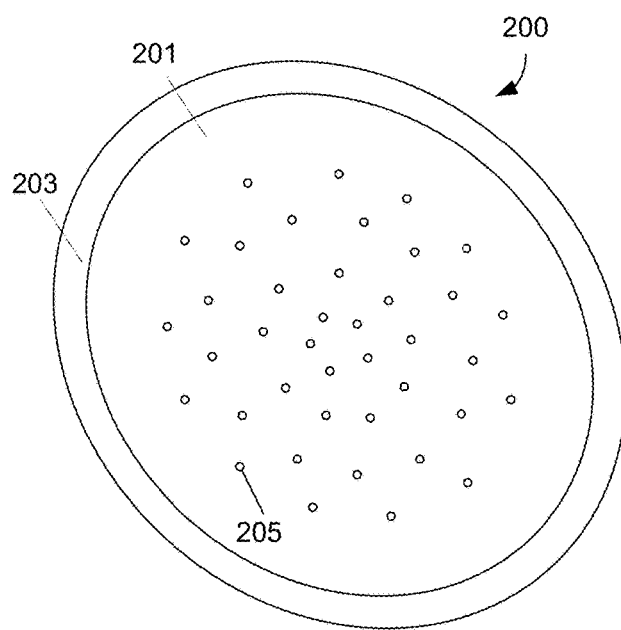

FIGS. 2A and 2B present alternate views (looking at the top and bottom, respectively) of a showerhead 200 that may be coated with a protective coating using the techniques described herein. In some cases, a showerhead 200 as shown in FIGS. 2A and 2B may be installed in a reactor used for chemical vapor deposition and/or atomic layer deposition. In some embodiments, the reactor is a deposition reaction chamber or an inhibition reaction chamber. The showerhead 200 includes a plate 201 in which a plurality of holes 205 are formed. In some cases, around 2000 holes 205 may be provided. An edge region 203 includes space and openings that may be used to install the showerhead 200 within a reaction chamber used to process semiconductor wafers. While FIGS. 2A and 2B show a region on the plate 201 interior of the edge region 203 where no holes 205 are provided, this is not always the case. In some embodiments, the holes 205 may be provided all the way to the edge region 203. In this example, various holes 205 are positioned along concentric circles, though other hole patterns may also be used.

Figure 2C:
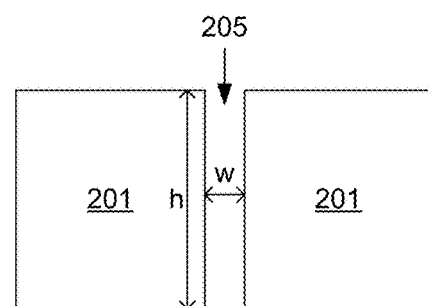
FIG. 2C depicts a close-up cross-sectional view of a hole in a showerhead according to certain embodiments.
Figure 2D:
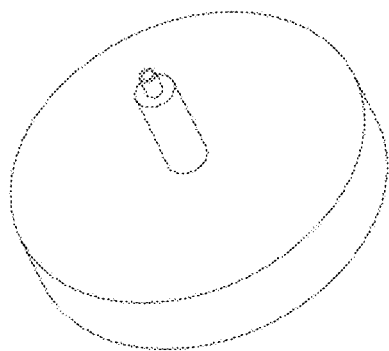
FIGS. 2D-2G show a showerhead that may be coated with a protective coating using the techniques described herein.
Figure 2E:
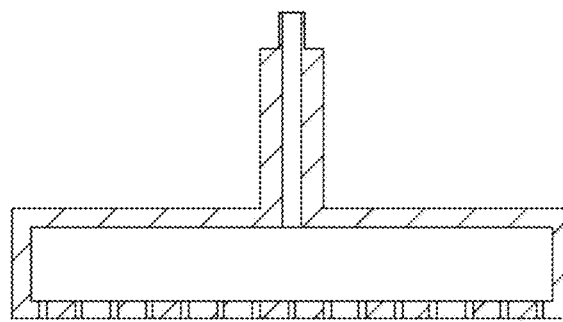
Figure 2F:
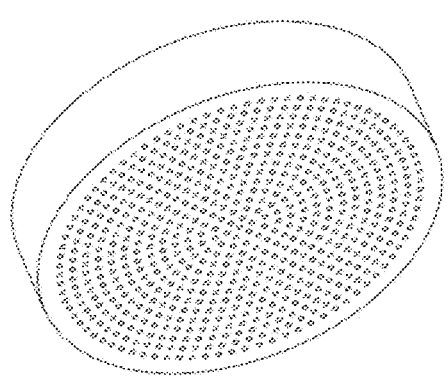
Figure 2G:
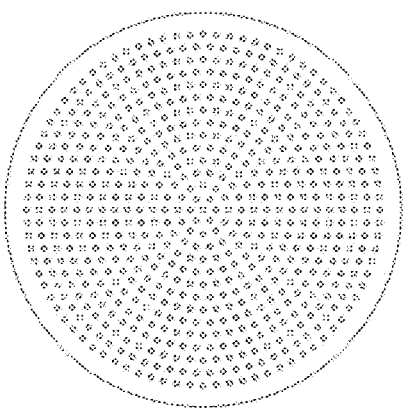

FIG. 2C depicts a close-up cross-sectional view of hole 205 from FIGS. 2A and 2B. The hole 205 has a width (sometimes referred to as its diameter or critical diameter) marked "w" and a height marked "h." The height of the hole 205 in this example is the same as the thickness of the plate 201 in which the hole 205 is formed. In various embodiments, a showerhead may have one or more holes that extend through the thickness of the plate, the hole(s) having a width between about 0.5-4 mm, and/or a height between about 1-20 mm. In some cases, the showerhead may include a stack of plates with non-aligned holes to improve gas mixing, for example in a multi-plenum showerhead.

The aspect ratio of a hole is a comparison of the height of the hole to the width of the hole (h:w). The aspect ratio can be numerically calculated as the height of the hole divided by the width of the hole (h/w). In certain embodiments herein, a showerhead hole may have an aspect ratio of at least about 5, or at least about 10, or at least about 50, or at least about 100, or at least about 500. In some cases, a showerhead hole may have an aspect ratio of up to about 2000. This very high aspect ratio renders the holes difficult to coat when the showerhead is installed in situ within a reaction chamber, for example because it is difficult to deliver the all of the necessary reactants to all the relevant surfaces, and/or because it is difficult to expose all of the relevant surfaces to plasma (e.g., in cases where the coating forms as a result of exposure to plasma). By using a thermally driven ALD reaction to coat the showerhead ex situ in a different reaction chamber, the necessary reactants can be delivered as needed to all the relevant surfaces, and the necessary energy to drive the reaction is applied in a uniform manner. As a result, the protective coating that forms is highly conformal, even on difficult to access surfaces such as the inside of showerhead holes and the back side of a showerhead. While FIG. 2C is explained in the context of FIGS. 2A and 2B, it is understood that any of the showerheads described herein can include holes having the described features (e.g., dimensions).

FIGS. 2D-2G present alternate views of a showerhead that may coated with a protective coating using the techniques described herein. In various embodiments, the showerhead shown in FIGS. 2D-2G is a powered showerhead. In many cases, this type of showerhead is referred to as a chandelier showerhead. In these or other embodiments, the showerhead shown in FIGS. 2D-2G may be a grounded showerhead. In some embodiments, the showerhead shown in FIGS. 2D-2G may be installed in a reaction chamber used for chemical vapor deposition or plasma enhanced chemical vapor deposition such as a reactor from the Vector® product family available from Lam Research Corporation of Fremont, CA.

Figure 3A:
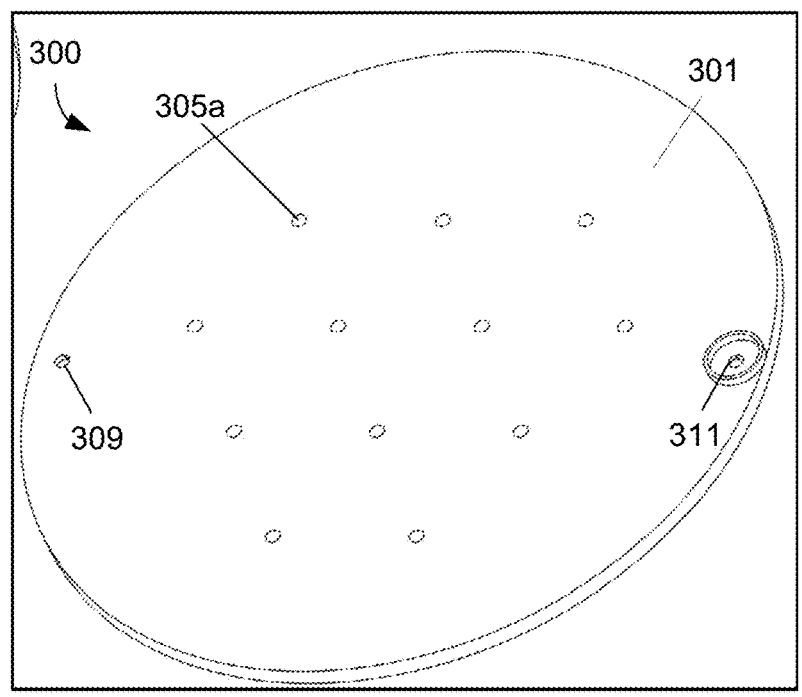
FIGS. 3A and 3B illustrate a showerhead that may be coated with a protective coating using the techniques described herein.
Figure 3B:
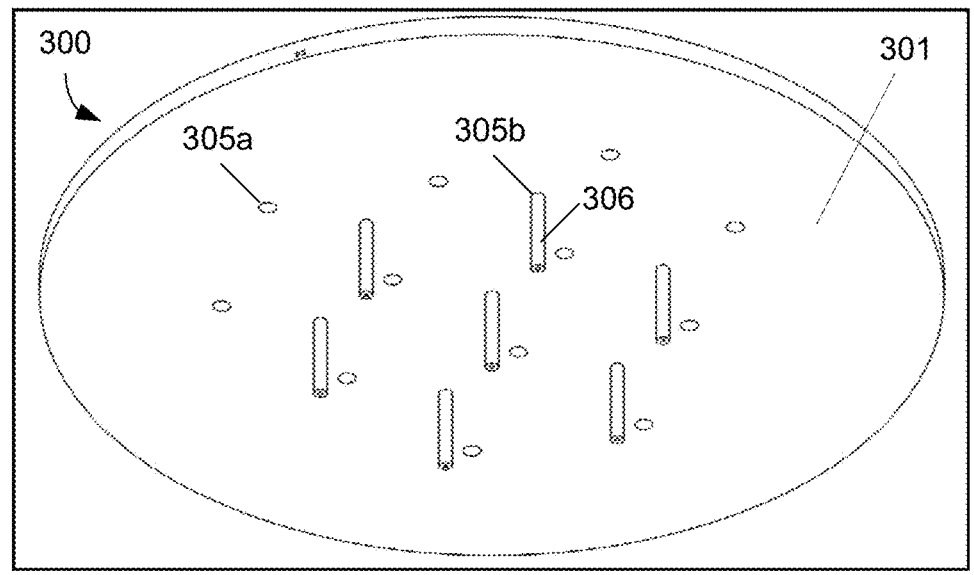

FIGS. 3A and 3B present alternate views (looking at the top and bottom, respectively) of a showerhead 300 that may be coated with a protective coating using the techniques described herein. In some cases, a showerhead 300 as shown in FIGS. 3A and 3B may be installed in a reaction chamber used for atomic layer deposition. In these or other cases, this temperature may be about 500. The showerhead 300 includes a plate 301 having a number of first holes 305a and second holes 305b. The first holes 305a extend all the way through the plate 301, while the second holes 305b are open only to the bottom side (sometimes referred to as the back side) of the showerhead 300. The showerhead 300 includes internal passages (not shown) that provide reactants to the second holes 305b. The reactants pass through nozzles 306 when exiting the second holes 305b. The nozzles 306 may be referred to as secondary gas injectors. The internal passages may be fed by dedicated reactant delivery lines (not shown), which may connect with the showerhead 300 at a gas inlet port (not shown). In some cases, additional separated internal passages may be provided in the plate 301 in order to provide additional reactants that do not mix with one another until after exiting the showerhead 300. Even these internal passages may be coated with the protective coating when ex situ atomic layer deposition is used to form the protective coating. Additional gas inlet ports (not shown) may be provided as desired for delivery of additional process gases. A single gas inlet port may be used to provide a single reactant or multiple different reactants, depending on the reactant delivery system and the needs of the process. Liquid may be provided to and/or removed from the showerhead 300 via thermal fluid connections 309 and 311. The thermal fluid may be a heat exchange fluid used to heat and/or cool the showerhead 300. The thermal fluid connections 309 and 311 may be masked before the protective coating is deposited in some embodiments. In certain cases, the bottom and top side of the showerhead may be reversed, such that the holes 305b open to the top side of the showerhead. The showerhead may be used in either orientation. Various hole patterns may be used.

In various embodiments, the protective coating may be formed on the nozzles 306 and on the rest of the showerhead 300 while the nozzles 306 are unconnected from the showerhead 300. After forming the coating on both the nozzles 306 and the rest of the showerhead 300, the nozzles 306 can be connected to the second holes 305b to complete fabrication of the showerhead 300. In another embodiment, the entire showerhead 300 is coated with the protective coating while nozzles the 306 are connected. An o-ring (not shown) may be provided between the nozzle 306 and the plate 301 to ensure a gas-tight connection.

Figure 4:
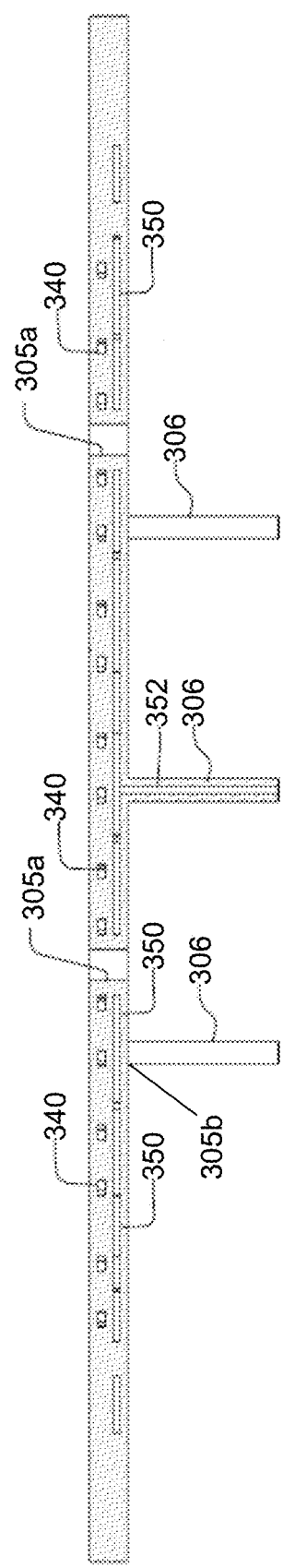
FIG. 4 illustrates a side-view of the showerhead shown in FIGS. 3A and 3B.

FIG. 4 illustrates a cross-sectional view of the showerhead 300 shown in FIGS. 3A and 3B. As noted above, the first holes 305a extend all the way through the thickness of the showerhead 300. Nozzles 306 are fitted onto the second holes 305b. The nozzles 306 and second holes 305b deliver gas phase reactants from one or more gas plenums 350 that are formed in the body of the showerhead 300. The gas plenums 350 receive gas from a gas inlet (not shown). The nozzles 306 include a gas delivery passage 352 therein. The body of the showerhead 300 further includes one or more cooling plenums 340 through which a heat exchange fluid may flow.

Figure 5A:
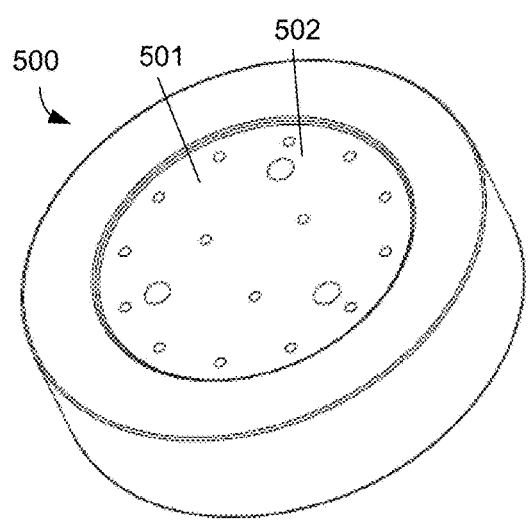
FIGS. 5A-5C illustrate a substrate support pedestal that may be coated with a protective coating using the techniques described herein.
Figure 5B:
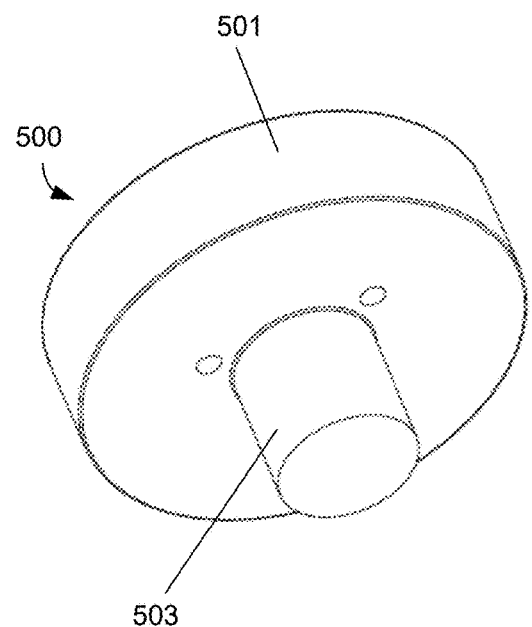
Figure 5C:
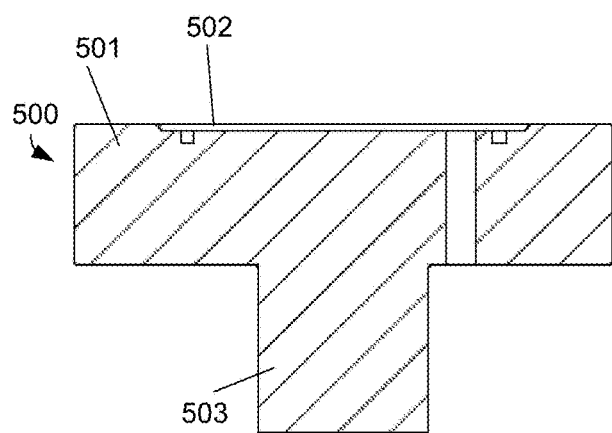
Figure 6:
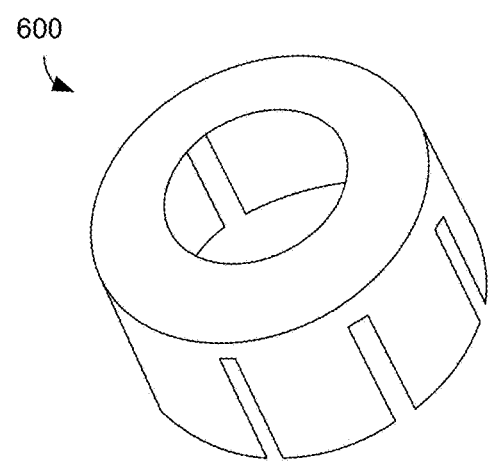
FIG. 6 depicts a lift pin holder that may be coated with a protective coating using the techniques described herein.

FIGS. 5A-5C illustrate alternate views of a substrate support pedestal 500 that may be coated with a protective coating using the techniques described herein. In some cases, a substrate support pedestal 500 as shown in FIGS. 5A-5C may be installed in a reaction chamber used for atomic layer deposition. The substrate support pedestal 500 includes a body portion 501 having a surface 502 on which a semiconductor wafer is supported during processing. The surface 502 includes a number of openings, some of which are lift pin openings. Lift pins (not shown) may be provided within the lift pin openings. The lift pins may operate to lift a semiconductor wafer to facilitate transfer of the wafer into and out of the reaction chamber. Similarly, lift pin holders (not shown) may be provided in the lift pin openings. The lift pins may pass through the lift pin holders as needed. An example lift pin holder is shown in FIG. 6. The lift pins and lift pin holders (as well as any other separable portions of the substrate support pedestal 500) may be coated together with the rest of the substrate support pedestal 500, or they may be coated separately. In the case where these parts are coated separately, the substrate support pedestal 500 may be assembled after all of the necessary parts are coated. The assembled support pedestal can then be installed in a reaction chamber. The body 501 of the substrate support pedestal 500 is connected to and supported by a stem 503. Certain areas may be masked before the protective coating is formed. For example, any regions where electrical contacts are formed may be masked to ensure that the contacts remain accessible and conductive. Masking of the electrical contact regions (and any other masked regions) is easier where the protective coating is formed ex situ compared to cases where it is formed as an in situ undercoat. For example, the relevant chamber component to be coated can be easily handled/manipulated (or even disassembled) to coat all relevant surfaces, since it isn't installed as an integral chamber component.

FIG. 6 illustrates a lift pin holder 600 that may be coated with a protective coating using the techniques described herein. In some cases, a lift pin holder 600 as shown in FIG. 6 may be provided in a reaction chamber used for atomic layer deposition. A lift pin (not shown) may extend through the center opening of the lift pin holder 600 to engage a semiconductor wafer. With reference to FIG. 5A, the lift pin holder 600 may be provided in the body 502 of the substrate support pedestal 500.

While various figures are described with reference to specific types of processing and specific reaction chambers, it is understood that the parts shown in these figures may be provided in alternate types of reaction chambers, and may be used for various kinds of processing on semiconductor substrates. Examples of additional apparatus that may benefit from the disclosed embodiments include, but are not limited to, any of the apparatus from the Altus® product family (chemical vapor deposition and atomic layer deposition), any of the apparatus from the Vector® product family (plasma-enhanced chemical vapor deposition), any of the apparatus from the Striker® product family (atomic layer deposition), any of the apparatus from the Speed® product family (high-density plasma chemical vapor deposition), etc. Each of these product families is available from Lam Research Corporation of Fremont, CA Characteristics of Protective Coating The protective coating may have particular characteristics in certain embodiments. For instance, the protective coating may have a particular composition, density, elastic modulus, hardness, adhesion to underlying layers, stress, crystal structure, purity, and/or thickness. The desired characteristics may depend on the type of reaction chamber that the chamber component will be used for, as well as the type of processing occurring in the reaction chamber. Example characteristics are provided herein, but are not intended to be limiting.

As mentioned above, a number of different compositions may be used for the protective coating. In a number of embodiments, the protective coating may be aluminum oxide ($Al_xO_y$) aluminum nitride ($Al_xN_y$), aluminum fluoride ($Al_xF_y$), aluminum oxynitride ($Al_xO_yN_z$), yttrium oxide ($Y_xO_y$), yttrium fluoride ($Y_xF_y$), or a combination thereof. These materials are believed to exhibit a strong resistance to fluorine-radical based plasmas (e.g., $NF_3$ cleaning plasma), ammonia plasma, and other plasmas (e.g., $Ar+N_2$ plasma, $Ar+N_2+O_2$ plasma, and $Ar+O_2$ plasma) commonly used during semiconductor processing. These types of plasmas can have serious detrimental effects when used with uncoated chamber components, which may result in substantial metallic contamination on semiconductor wafers.

In certain embodiments, the protective coating may have an elastic modulus between about 100-400 GPa for all temperatures between about 150-300° C. In these or other cases, the protective coating may have a hardness between about 6-18 GPa for all temperatures between about 150-300° C. In these or other cases, the protective coating may have an adhesion of at least about 200 mN, in some cases at least about 1 N or at least about 5 N, to an underlying material. The adhesion may be measured based on ASTM D7187 scratch adhesion testing. In these or other cases, the protective coating may have a maximum stress (compressive) of about 500 MPa for all temperatures greater than about 150° C. In these or other cases, the protective coating may have a crystal structure that is amorphous (as determined by x-ray diffraction). In these or other cases, the protective coating may have a purity between about 99.9-99.999%. In these or other cases, the protective coating may have a thickness between about 100-500 nm, as discussed elsewhere herein. In these or other cases, the protective coating may have less than about 3% variation in thickness across all surfaces on which it deposits.

Process Stability

In various embodiments herein, a reaction chamber having one or more chamber components (e.g., showerhead, pedestal, etc.) prepared to include a protective coating as described herein is operated to achieve a particular degree of process stability over the course of processing many semiconductor wafers. Process stability issues are further described below in relation to FIGS. 8A and 8B.

In certain cases, the process stability may be analyzed by tracking the on-wafer non-uniformity for films deposited in the reaction chamber over time. The on-wafer non-uniformity is calculated as the thickness difference between the thickest and thinnest regions of the film. For example, a first film that ranges in thickness between 48-52 Å and has an average thickness of 50 Å has an on-wafer non-uniformity of 4 Å (52 Å−48 Å=4 Å). In many cases, the variation in on-wafer non-uniformity is analyzed with reference to the average thickness of the films. For example, a second film that ranges in thickness between 48-51 Å and has an average thickness of 50 Å has an on-wafer non-uniformity of 3 Å. The change in the on-wafer non-uniformity between the first and second films is 1 Å (4 Å−3 Å=1 Å). As compared to the average film thickness (50 Å), this represents a variation of 2% (1 Å/50 Å*100=2%).

When comparing films from different batches, the same wafer number should be considered from the different batches to minimize any differences that result from within-batch variations/trends. The wafer number is the order in which the wafers are processed within the batch. Thus, when comparing a first batch to a third batch, the first wafer in the first batch and the first wafer in the third batch could be measured and compared. In a similar example, the fiftieth wafer in the first batch and the fiftieth wafer in the third batch could be measured.

The variation in the on-wafer non-uniformity over the course of the batches may be no greater than about 5%, or no greater than about 3%, or no greater than about 2%, or no greater than about 1%, or no greater than about 0.05% of the average film thickness. In many embodiments, this extremely low variation can be maintained over the course of at last about 10, or at least about 20 batches. The film deposited on the wafers may have any composition, and in a particular example the film is silicon carbide or a silicon carbide derivative. With reference to the example described in FIG. 8A, the coated showerhead allowed the reaction chamber to achieve a variation in on-wafer non-uniformity of only about 0.05% of the average film thickness over the course of 20 batches (each batch including 200 wafers) for silicon carbide films deposited on semiconductor wafers. This degree of stability was not achievable in a similar process using an uncoated showerhead.

The batch sizes for achieving the recited degree of process stability may be within the ranges described herein. The film deposited on each wafer may be at least about 50 Å thick, at least about 100 Å thick, at least about 200 Å thick, at least about 500 Å thick, or greater.

In Situ Recovery of Coated Chamber Components

As mentioned above, repeated exposure to processing gases and plasmas can affect the surface of the chamber components. While the use of ex situ coating by ALD substantially improves the resistance of such chamber components to such exposure, these conditions can eventually alter the surface of the coated chamber components in various embodiments. For instance, an aluminum oxide coating on a showerhead, pedestal, or other chamber component that is repeatedly exposed to a nitrogen-containing plasma may eventually form AlN or AlON bonds thereon. These bonds effectively act as surface contaminants, and it may be desirable to remove them. Similarly, exposure of an aluminum nitride coating on a showerhead, pedestal, or other chamber component that is repeatedly exposed to an oxygen-containing plasma may eventually form AlO or AlNO bonds thereon that act as surface contaminants. Many other examples are possible. These changing surface conditions/contaminants can negatively affect the on-wafer processing results. For instance, as the surfaces of the chamber components become more contaminated, radicals in the reaction chamber are increasingly lost to the contaminated surfaces, and are decreasingly available for processing the substrate. In some embodiments, this may lead to a noticeable trend in on-wafer performance (e.g., thickness, uniformity, etc.) over time. Such trending is undesirable because a high degree of uniformity is desired between different substrates processed at different times, and any trending in the on-wafer results reduces such uniformity.

The surface contaminants can be removed and the condition of the coated chamber component can be restored in a number of ways. Several examples are discussed herein. Generally, these examples concern cases where the coated chamber component is conditioned in situ in the reaction chamber in which it is installed (e.g., the reaction chamber used to process semiconductor wafers, not the reaction chamber used to initially coat the chamber component ex situ). These examples can be combined as desired for a particular application.

Example 1: Restoration Plasma

The reaction chamber used to process semiconductor wafers may be conditioned by exposing the reaction chamber to a restoration plasma. The restoration plasma acts to remove contaminants from the surface of the coated chamber components, and restores the surface of the coated chamber component to its intended composition (and in some cases, structure).

The restoration plasma is generated from a restoration plasma generation gas. The restoration plasma generation gas often includes at least one component that is found in the coating of the chamber component. For example, a showerhead (or other chamber component) coated ex situ with metal oxide may be exposed to a restoration plasma generated from a restoration plasma generation gas that includes $O_2$ or another oxygen-containing species. Similarly, a showerhead (or other chamber component) coated ex situ with metal nitride may be exposed to a restoration plasma generated from a restoration plasma generation gas that includes $N_2$ or another nitrogen-containing species. A showerhead (or other chamber component) coated ex situ with metal fluoride may be exposed to a restoration plasma generated from a restoration plasma generation gas that includes $F_2$ or another fluorine-containing species. In any case, the restoration plasma generation gas may also include one or more inert species such as a noble gas (e.g., Ar, He, Ne, etc.). In various embodiments, the restoration plasma generation gas may be free or substantially free (e.g., including only trace amounts) of metal and/or silicon.

The restoration plasma may be generated directly in the reaction chamber used to process semiconductor wafers, or it may be generated remotely and delivered to this reaction chamber. In some embodiments, the reaction chamber may be exposed to the restoration plasma for a duration between about 1 minute and 24 hours. In some cases this duration is between about 1-60 minutes, between about 1-20 minutes, between about 1-15 minutes, between about 1-2 minutes, or between about 1-24 hours. In some cases, this duration is at least about 1 minute, at least about 2 minutes, at least about 5 minutes, or at least about 10 minutes. In these or other cases, this duration may be about 24 hours or less, about 1 hour or less, about 20 minutes or less, about 15 minutes or less, about 10 minutes or less, or about 2 minutes or less.

In many cases the restoration plasma is provided continuously within this duration, although the restoration plasma may also be provided periodically or intermittently within this duration (e.g., 30 minutes of plasma on, followed by 30 minutes of plasma off). Intermittent plasma may be used to prevent overheating on chamber components from the plasma. The pressure within the reaction chamber during this conditioning step may be between about 0.01-100 mTorr, or between about 0.2-5 Torr, or between about 0.5-5 Torr, or between about 5-40 Torr. In these or other cases, the pressure may be at least about 0.01 mTorr, at least about 0.2 Torr, or at least about 0.5 Torr. In these or other cases, the pressure may be about 40 Torr or less, about 5 Torr or less, or about 1 Torr or less. In some cases, the temperature of one or more chamber components may be controlled during this conditioning step. For instance, in some such cases one or more chamber components (e.g., showerhead, pedestal, etc.) and/or the chamber itself (e.g., chamber walls, floor, ceiling, etc.) may be maintained at a temperature between about 70-400° C., in some cases between about 70-200° C., or between about 70-100° C., or between about 80-160° C., or between about 150-400° C. In some such cases, this temperature may be at least about 70° C., at least about 100° C., or at least about 150° C. In these or other cases, this temperature may be about 400° C. or less, about 200° C. or less, about 160° C. or less, or about 100° C. or less. The restoration plasma may be generated at a range of power levels and frequencies, for example between about 1000-10,000 Watts per 300 mm substrate (e.g., 1000-3000 Watts per 300 mm substrate) and between about 50 kHz and 2.45 GHz (e.g., 50-700 kHz, 300-500 kHz, or 1.8 MHz-2.45 GHz, or 10-20 MHz, or 50-70 MHz) plasma frequency.

The restoration plasma (or other conditioning technique) may be provided at a particular frequency. In some cases, the conditioning is performed each time after a wafer is processed in the reaction chamber. In other cases, the conditioning may be performed after n wafers are processed in the reaction chamber, where n is 2, 3, 4, 5, 10, 20, 50, 75, 100, 200, 300, 400, or 500. The optimal frequency for conditioning will depend on a number of factors including the process being performed on the wafer, the materials provided to the reaction chamber, timing, etc. Generally, more frequent cleanings minimize trending of on-wafer results. However, throughput may begin to suffer if the cleanings occur too frequently.

In some cases, a restoration plasma may be provided to the reaction chamber with the coated chamber components therein, even before the coated chamber components are used to process any substrates. In such cases, the restoration plasma acts not to restore the surface of the coated chamber components (since they are still new), but to condition the coated chamber components to prepare them for the chemistry that will be used during processing. In such examples, the restoration plasma may be referred to as an in situ conditioning plasma. This in situ conditioning may be repeated any number of times, and in many cases takes place immediately prior to use, e.g., when a new coated chamber component is installed and/or when a new processing chemistry is introduced. Often, the in situ conditioning plasma is an $O_2$ plasma and the chamber component is coated with aluminum oxide or another oxide, though other compositions/materials may be used in various cases. In situ conditioning plasmas are further discussed in U.S. patent application Ser. No. 14/712,167, filed Mar. 26, 2015, and titled "MINIMIZING RADICAL RECOMBINATION USING ALD SILICON OXIDE SURFACE COATING WITH INTERMITTENT RESTORATION PLASMA," which is incorporated by reference above.

In many cases, no wafer is present in the reaction chamber when the conditioning is occurring. In some other cases, a wafer or a dummy wafer (e.g., a sacrificial wafer not intended for production) may be present in the reaction chamber when the conditioning is occurring.

Experimental results, discussed below with reference to FIGS. 10A and 10B, indicate that the use of a restoration plasma can substantially decrease the time it takes to restore a reaction chamber (or a coated chamber component therein) to a usable state for use in processing semiconductor substrates. Further, in various cases the restoration plasma may be used to restore the coating on a coated chamber component that has otherwise reached the end of its useful life (e.g., to restore a coated chamber component that was unrecoverable through other techniques such as waiting extended periods of time).

Example 2: Restoration Plasma with Additional Reactant

In Example 1, the restoration plasma generation gas includes a single type of reactive species (e.g., a reactive oxygen species for restoring an oxide-based coating, a reactive nitrogen species for restoring a nitride-based coating, a reactive fluoride species for restoring a fluoride-based coating, etc.). By contrast, in Example 2, the restoration plasma generation gas includes two or more species that may react with one another. The two species may react to form the desired composition for the coating on the chamber components. For example, a showerhead (or other chamber component) coated with aluminum oxide may be exposed to a restoration plasma generated from a restoration plasma generation gas that includes both an aluminum-containing reactant and an oxygen-containing reactant (e.g., $O_2$, etc.). A showerhead (or other chamber component) coated with aluminum nitride may be exposed to a restoration plasma generated from a restoration plasma generation gas that includes both an aluminum-containing reactant and a nitrogen-containing reactant (e.g., $N_2$, etc.). A showerhead (or other chamber component) coated with aluminum fluoride may be exposed to a restoration plasma generated from a restoration plasma generation gas that includes both an aluminum-containing reactant and a fluoride-containing reactant (e.g., $F_2$, etc.). While the preceding examples relate to aluminum-containing coatings, it is understood that the coatings and reactants are not so limited. Where the coating contains a metal or material other than aluminum, at least one of the reactants can be selected to provide the relevant metal or material.

The two or more reactants may be provided together at the same time, or they may be provided at different times (e.g., such that the composition of the restoration plasma generation gas changes over time). In a particular example, the reactants are staggered such that the reaction to restore and re-form the coating on the chamber components can occur via surface reactions that are self-limiting.

In some embodiments, the restoration plasma is provided continuously and both of the reactants are used in plasma form. In some other embodiments, the restoration plasma may be provided periodically or intermittently. In some such cases, one or more of the reactants (e.g., a metal containing reactant in some cases) may be provided to the reaction chamber in gas form, when no plasma is present.

Any details provided with respect to Example 1 may also apply to Example 2.

Example 3: Restoration Plasma with Staged $O_2$, $N_2$ Plasmas

In this example, the reaction chamber used to process semiconductor wafers is exposed to different plasmas at different times in order to recondition and reform the coating on the relevant chamber components. First, the reaction chamber is exposed to an oxygen plasma (e.g., generated from an oxygen-containing species such as $O_2$, etc., and in many cases including an inert gas such as Ar, He, etc.). After this first plasma exposure, the reaction chamber is exposed to a nitrogen plasma (e.g., generated from a nitrogen-containing species such as $N_2$, etc., and in many cases including an inert gas such as Ar, He, etc.). The reaction chamber may be exposed to the oxygen plasma for a duration between about 30 seconds-2 minutes, and then to the nitrogen plasma for a duration between about 1-30 second. In various cases there may be particular ratio between the duration of exposure to oxygen plasma and the duration of exposure to nitrogen plasma. In some such embodiments, the duration over which the reaction chamber is exposed to oxygen plasma may be at least about 5 times, at least about 10 times, or at least about 15 times, the duration over which the reaction chamber is exposed to the nitrogen plasma. The duration of the exposure may be selected to achieve a particular level of throughput and process uniformity, with longer durations usually resulting in lower throughput and higher process uniformity.

In certain embodiments, the oxygen plasma may have a composition that is between about 10-50% oxygen, or between about 10-20% oxygen, with the remainder being inert gas. In these or other embodiments, the nitrogen plasma may have a composition that is between about 0.1-5% nitrogen, or between about 0.5-2% nitrogen, with the remainder being inert gas. The nitrogen plasma may have a higher composition of inert gas compared to the oxygen plasma in some embodiments. In other cases, the opposite may be true.

In some cases, different plasma generation conditions may be applied when the reaction chamber is exposed to the oxygen plasma vs. the nitrogen plasma. For instance, in one embodiment the oxygen plasma is a continuous wave plasma and the nitrogen plasma is pulsed, e.g., with a duty cycle of less than 50%. The power (e.g., RF power in many cases) used to generate the different plasmas may also be different. In one example, the power used to generate the oxygen plasma may be greater than the power used to generate the nitrogen plasma (in some cases, at least twice as great). Example power levels for generating the plasmas include, but are not limited to, about 500-2500 W per 300 mm substrate.

Experimental results, discussed further below with respect to FIGS. 11A and 11B, show that this staged conditioning technique significantly reduces or even eliminates the trending observed in the on-wafer processing results, described above, thereby achieving much more uniform products. This increases the reliability of the reaction chamber, thereby maximizing value.

Any details provided with respect to Examples 1 and 2 may also apply to Example 3.

Example 4: Thorough Chamber Clean with Wet or Dry Chemistry

In some cases, a more thorough cleaning process may be needed to restore the surface of the coated chamber components. This may be the case when the chamber component is coated with a particularly thick film formed as a byproduct of processing on semiconductor wafers. In one example, a chamber component that was coated ex situ with aluminum oxide (or another coating material) becomes covered in silicon oxide (or another byproduct material) after the chamber component is used to process semiconductor wafers in a relevant reaction chamber. The chamber component can be cleaned using wet or dry chemistry (with or without plasma) to remove the byproduct material. In one example, the reaction chamber is exposed to plasma generated (directly or remotely) from at least one of $F_2$, $NF_3$, or a different fluorine-containing cleaning reactant. In another example, the reaction chamber (or a relevant coated chamber component) may be exposed to wet chemistry to remove the byproduct material. Example wet chemistries include, but are not limited to, various acids and bases, alcohols, water, deionized water, acetone, etc. Some particular examples include ammonium hydroxide ($NH_4OH$), hydrogen peroxide ($H_2O_2$), hydrochloric acid (HCl), hydrofluoric acid (HF), nitric acid ($HNO_3$), isopropyl alcohol ($C_3H_8O$), etc.

While Example 1 and certain embodiments of Example 4 each involve exposing the reaction chamber to plasma to thereby condition the coated chamber components, there are some important distinctions between these two embodiments. In Example 1, the restoration plasma generation gas typically includes at least one component that is in the coating of the coated chamber component (e.g., oxygen in the case of an oxide coating, nitrogen in the case of a nitride coating, etc.). By contrast, in Example 4, the chemistry is typically cleaning chemistry (e.g., fluorine-containing chemistry in many cases). In various cases, the cleaning chemistry does not include components found in the coating of the coated chamber components. For instance, where the coating on the chamber components is aluminum oxide, an $F_2$ or $NF_3$ plasma may be particularly appropriate for cleaning the chamber components according to Example 4 since neither $F_2$ nor $NF_3$ includes aluminum or oxygen. Relatedly, if an aluminum fluoride coated chamber component is exposed to $F_2$ plasma, it would be considered a restoration plasma under Example 1, since the coating and the plasma both include fluorine.

Where wet or dry chemistry techniques are used, the coated chamber components may be exposed to the wet chemistry or dry chemistry (e.g., plasma) for a duration between about 0.5 seconds and 24 hours, depending on the technique that is used. In some cases, the duration may be between about 0.5 seconds and 2 minutes, or between about 1-30 seconds, or between about 1-15 minutes, or between about 1-60 minutes, or between about 1-24 hours. In some cases, the duration may be at least about 0.5 seconds, at least about 1 second, at least about 10 seconds, at least about 30 seconds, at least about 1 minute, at least about 10 minutes, at least about 30 minutes, or at least about 1 hour. In these or other cases, the duration may be about 24 hours or less, about 1 hour or less, about 30 minutes or less, about 10 minutes or less, about 1 minute or less, about 30 seconds or less, or about 10 seconds or less.

The cleaning operation may leave some fluorine on the surface of the coated chamber component. This fluorine can be removed using a restoration plasma as described in relation to Example 1, or it can be removed using, e.g., a reducing plasma such as an $H_2$ plasma. Where an $H_2$ plasma is used, any remaining fluorine on the coated chamber components can be removed/extracted in the form of HF, which can be pumped out from the reaction chamber. The cleaning techniques described in relation to Example 4 may beneficially reduce particle formation on the semiconductor wafers. The cleaning operation may be done intermittently or periodically as needed.

Example 5: Thorough Chamber Clean Followed by Restoration Plasma

This example is a particular embodiment that utilizes both Examples 1 and 4. After the reaction chamber or chamber components are cleaned with wet or dry chemistry as described in Example 4, the reaction chamber is exposed to a restoration plasma as described in relation to Example 1. This technique can be used to restore the coated chamber component to nearly pristine conditions, such that the surface of the coated chamber component is essentially "like new" (e.g., having the same or very similar properties as the coated chamber component after it is first coated ex situ and installed in the reaction chamber used to process semiconductor wafers). Details provided in relation to Examples 1 and 4 may also apply to Example 5.

Example 6: Any Other Combination of Examples 1-5

Examples 1-5 may be combined as desired for a particular application. Similarly, these examples may be combined with any of the other techniques described herein, including but not limited to delaying the surface composition change of coated chamber components by controlling temperature, as described further below. These techniques can work together to provide superior results and uniformity.

Delaying Surface Composition Change of Coated Components

In some embodiments, certain steps may be taken to delay changes in the surface composition of chamber components that are coated as described herein. Such steps may include heating the coated chamber components and/or heating the reaction chamber to an elevated temperature (e.g., above standard room temperature, and in some cases above a temperature used when processing semiconductor wafers).

The elevated temperature may be between about 40-100° C. in many applications. In certain particular applications, the elevated temperature may be at least about 40° C., at least about 50° C., at least about 60° C., at least about 70° C., at least about 80° C., or at least about 90° C. In these or other applications, the elevated temperature may be about 120° C. or less, about 100° C. or less, about 90° C. or less, about 80° C. or less, about 70° C. or less, or about 60° C. or less. The ideal temperature may depend on the particular application being considered, including, e.g., the composition of the coating on the coated chamber component, the composition of reactants/byproducts used in the reaction chamber, and the heating characteristics of various chamber components.

In some embodiments, the coated chamber component and/or reaction chamber may be raised to the elevated temperature intermittently or periodically as the reaction chamber is used to process semiconductor wafers. For instance, the coated chamber component and/or reaction chamber may be raised to the elevated temperature between processing subsequent semiconductor wafers (e.g., after each semiconductor wafer is processed, or after a certain number of semiconductor wafers are processed). A semiconductor wafer may or may not be present in the reaction chamber when the elevated temperature is provided. In another example, the coated chamber component and/or reaction chamber may be raised to the elevated temperature during one or more processing steps while processing the semiconductor wafers. In some other embodiments, the elevated temperature may be provided on a continuous basis (e.g., while processing semiconductor wafers, and between processing subsequent semiconductor wafers), without allowing the temperature of the component(s) to dip below a minimum threshold while the reaction chamber is in use.

In cases where the elevated temperature is provided intermittently or periodically, the duration over which the elevated temperature is provided may between about 30 minutes and 3 hours, in some cases between about 30-60 minutes, or between about 2-3 hours.

Experimental results, discussed further below with relation to FIGS. 12A-12H, illustrate that heating the showerhead as described herein significantly reduces drifting in properties observed over the course of a batch as additional semiconductor wafers are processed.

Apparatus

The methods described herein may be performed by any suitable apparatus. A suitable apparatus includes hardware for accomplishing the process operations and a system controller having instructions for controlling process operations in accordance with the present embodiments. For example, in some embodiments, the hardware may include one or more process stations included in a process tool.

Various embodiments herein relate to methods for preparing chamber components for installation in a reaction chamber. A first reaction chamber is used to prepare the chamber components by depositing a protective coating on the chamber components. The chamber components are then removed from the first reaction chamber and installed in a second reaction chamber, where the chamber components serve their intended purpose as the second reaction chamber is used to process semiconductor wafers. The first reaction chamber may be any reaction chamber that is (1) configured to perform atomic layer deposition, and (2) has a chamber sufficiently large to fit the chamber components being coated. The second reaction chamber can be any reaction chamber used to process semiconductor wafers. In many cases, the second reaction chamber is a reaction chamber used for atomic layer deposition and/or chemical vapor deposition.

Figure 7:
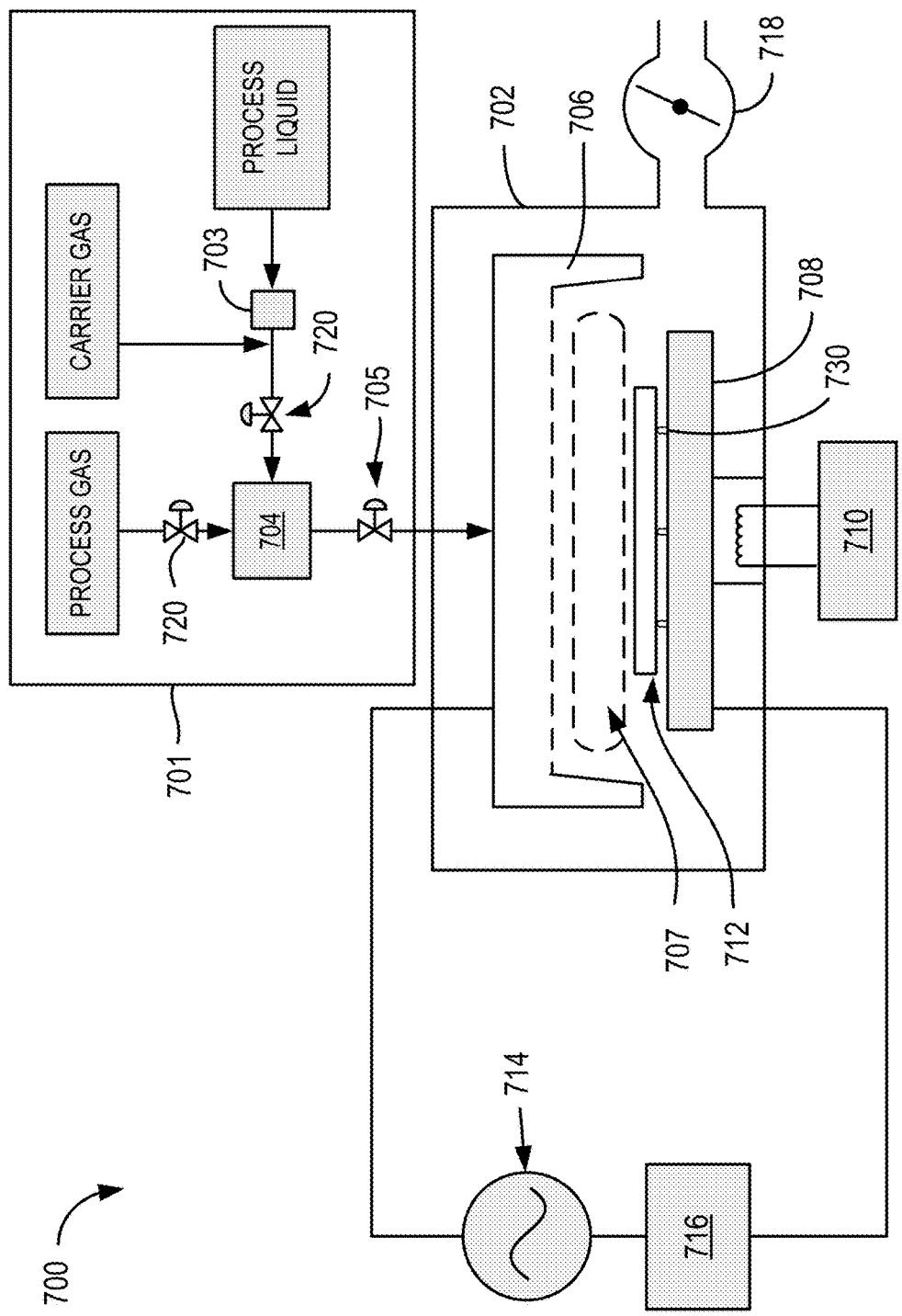
FIG. 7 illustrates a chamber component such as a showerhead being coated ex situ with a protective coating according to certain embodiments.

FIG. 7 schematically shows an embodiment of a process station 700 that may be used to deposit a protective coating on a chamber component as described herein. It is understood that the process station 700 of FIG. 7 could also be used for depositing film on semiconductor substrates (e.g., through atomic layer deposition and/or chemical vapor deposition), and any of the components therein may be coated using the techniques described herein. For simplicity, the process station 700 is depicted as a standalone process station having a process chamber body 702 for maintaining a low-pressure environment. However, it will be appreciated that a plurality of process stations 700 may be included in a common process tool environment. Further, it will be appreciated that, in some embodiments, one or more hardware parameters of process station 700, including those discussed in detail below, may be adjusted programmatically by one or more computer controllers.

Process station 700 fluidly communicates with reactant delivery system 701 for delivering process gases to a distribution showerhead 706. Reactant delivery system 701 includes a mixing vessel 704 for blending and/or conditioning process gases for delivery to showerhead 706. One or more mixing vessel inlet valves 720 may control introduction of process gases to mixing vessel 704. Similarly, a showerhead inlet valve 705 may control introduction of process gasses to the showerhead 706.

Some reactants, like BTBAS, may be stored in liquid form prior to vaporization at and subsequent delivery to the process station. For example, the embodiment of FIG. 7 includes a vaporization point 703 for vaporizing liquid reactant to be supplied to mixing vessel 704. The vaporization point 703 may be omitted in cases where the reactants are all gas. In some embodiments, vaporization point 703 may be a heated vaporizer. The reactant vapor produced from such vaporizers may condense in downstream delivery piping. Exposure of incompatible gases to the condensed reactant may create small particles. These small particles may clog piping, impede valve operation, contaminate substrates, etc. Some approaches to addressing these issues involve sweeping and/or evacuating the delivery piping to remove residual reactant. However, sweeping the delivery piping may increase process station cycle time, degrading process station throughput. Thus, in some embodiments, delivery piping downstream of vaporization point 703 may be heat traced. In some examples, mixing vessel 704 may also be heat traced. In one non-limiting example, piping downstream of vaporization point 703 has an increasing temperature profile extending from approximately 100° C. to approximately 150° C. at mixing vessel 704.

In some embodiments, reactant liquid may be vaporized at a liquid injector. For example, a liquid injector may inject pulses of a liquid reactant into a carrier gas stream upstream of the mixing vessel. In one scenario, a liquid injector may vaporize reactant by flashing the liquid from a higher pressure to a lower pressure. In another scenario, a liquid injector may atomize the liquid into dispersed microdroplets that are subsequently vaporized in a heated delivery pipe. It will be appreciated that smaller droplets may vaporize faster than larger droplets, reducing a delay between liquid injection and complete vaporization. Faster vaporization may reduce a length of piping downstream from vaporization point 703. In one scenario, a liquid injector may be mounted directly to mixing vessel 704. In another scenario, a liquid injector may be mounted directly to showerhead 706.

In some embodiments, a liquid flow controller upstream of vaporization point 703 may be provided for controlling a mass flow of liquid for vaporization and delivery to process station 700. For example, the liquid flow controller (LFC) may include a thermal mass flow meter (MFM) located downstream of the LFC. A plunger valve of the LFC may then be adjusted responsive to feedback control signals provided by a proportional-integral-derivative (PID) controller in electrical communication with the MFM. However, it may take one second or more to stabilize liquid flow using feedback control. This may extend a time for dosing a liquid reactant. Thus, in some embodiments, the LFC may be dynamically switched between a feedback control mode and a direct control mode. In some embodiments, the LFC may be dynamically switched from a feedback control mode to a direct control mode by disabling a sense tube of the LFC and the PID controller.

Showerhead 706 distributes process gases toward substrate 712. In the embodiment shown in FIG. 7, substrate 712 is located beneath showerhead 706, and is shown resting on lift pins 730 on a pedestal 708. The substrate 712 is the chamber component that is being coated. For instance, the substrate 712 may be any of the showerheads shown in FIG. 2A-2B, 2D-G, 3A-3B, or 4. The substrate 712 may also be a lift pin, lift pin holder, substrate support pedestal, reactant delivery line, or any other chamber component that is to be coated with the protective coating. While FIG. 7 shows only a single substrate 712 in the reaction chamber, it is understood that a plurality of substrates may be coated simultaneously in a single reaction chamber in certain embodiments. The pedestal 708, lift pins 730, and related hardware may be modified as desired to support particular chamber components during deposition to ensure that all relevant surfaces of the chamber component are coated. In some cases, the pedestal 708 may support the chamber component at its periphery such that a top face and bottom face of the chamber component are substantially exposed.

It will be appreciated that showerhead 706 may have any suitable shape, and may have any suitable number and arrangement of ports for distributing processes gases to substrate 712. Any of the showerheads shown herein may be used in certain cases.

In some embodiments, a microvolume 707 is located beneath showerhead 706. Performing an ALD and/or CVD process in a microvolume rather than in the entire volume of a process station may reduce reactant exposure and sweep times, may reduce times for altering process conditions (e.g., pressure, temperature, etc.), may limit an exposure of process station robotics to process gases, etc. Example microvolume sizes include, but are not limited to, volumes between 0.1 liter and 2 liters. Larger microvolumes may be needed to accommodate relatively larger chamber components. This microvolume also impacts productivity throughput. While deposition rate per cycle drops, the cycle time also simultaneously reduces. In certain cases, the effect of the latter is dramatic enough to improve overall throughput of the module for a given target thickness of film.

In some embodiments, pedestal 708 may be raised or lowered to expose substrate 712 to microvolume 707 and/or to vary a volume of microvolume 707. For example, in a substrate transfer phase, pedestal 708 may be lowered to allow substrate 712 to be loaded onto pedestal 708. During a deposition process phase, pedestal 708 may be raised to position substrate 712 within microvolume 707. In some embodiments, microvolume 707 may completely enclose substrate 712 as well as a portion of pedestal 708 to create a region of high flow impedance during a deposition process.

Optionally, pedestal 708 may be lowered and/or raised during portions the deposition process to modulate process pressure, reactant concentration, etc., within microvolume 707. In one scenario where process chamber body 702 remains at a base pressure during the deposition process, lowering pedestal 708 may allow microvolume 707 to be evacuated. Example ratios of microvolume to process chamber volume include, but are not limited to, volume ratios between 1:700 and 1:10. It will be appreciated that, in some embodiments, pedestal height may be adjusted programmatically by a suitable computer controller.

In another scenario, adjusting a height of pedestal 708 may allow a plasma density to be varied during plasma activation and/or treatment cycles included in the deposition process. At the conclusion of the deposition process phase, pedestal 708 may be lowered during another substrate transfer phase to allow removal of substrate 712 from pedestal 708.

While the example microvolume variations described herein refer to a height-adjustable pedestal, it will be appreciated that, in some embodiments, a position of showerhead 706 may be adjusted relative to pedestal 708 to vary a volume of microvolume 707. Further, it will be appreciated that a vertical position of pedestal 708 and/or showerhead 706 may be varied by any suitable mechanism within the scope of the present disclosure. In some embodiments, pedestal 708 may include a rotational axis for rotating an orientation of substrate 712. It will be appreciated that, in some embodiments, one or more of these example adjustments may be performed programmatically by one or more suitable computer controllers.

Returning to the embodiment shown in FIG. 7, showerhead 706 and pedestal 708 may electrically communicate with RF power supply 714 and matching network 716 for powering a plasma. In some embodiments, the plasma energy may be controlled by controlling one or more of a process station pressure, a gas concentration, an RF source power, an RF source frequency, and a plasma power pulse timing. For example, RF power supply 714 and matching network 716 may be operated at any suitable power to form a plasma having a desired composition of radical species. Examples of suitable powers are included above. Likewise, RF power supply 714 may provide RF power of any suitable frequency. In some embodiments, RF power supply 714 may be configured to control high- and low-frequency RF power sources independently of one another. Example low-frequency RF frequencies may include, but are not limited to, frequencies between 50 kHz and 700 kHz. Example high-frequency RF frequencies may include, but are not limited to, frequencies between 1.8 MHz and 2.45 GHz. It will be appreciated that any suitable parameters may be modulated discretely or continuously to provide plasma energy for the surface reactions. In one non-limiting example, the plasma power may be intermittently pulsed to reduce ion bombardment with the substrate surface relative to continuously powered plasmas.

In some embodiments, the plasma may be monitored in situ by one or more plasma monitors. In one scenario, plasma power may be monitored by one or more voltage, current sensors (e.g., VI probes). In another scenario, plasma density and/or process gas concentration may be measured by one or more optical emission spectroscopy sensors (OES). In some embodiments, one or more plasma parameters may be programmatically adjusted based on measurements from such in situ plasma monitors. For example, an OES sensor may be used in a feedback loop for providing programmatic control of plasma power. It will be appreciated that, in some embodiments, other monitors may be used to monitor the plasma and other process characteristics. Such monitors may include, but are not limited to, infrared (IR) monitors, acoustic monitors, and pressure transducers.

In some embodiments, the plasma may be controlled via input/output control (IOC) sequencing instructions. In one example, the instructions for setting plasma conditions for a plasma process phase may be included in a corresponding plasma activation recipe phase of a deposition process recipe. In some cases, process recipe phases may be sequentially arranged, so that all instructions for a deposition process phase are executed concurrently with that process phase. In some embodiments, instructions for setting one or more plasma parameters may be included in a recipe phase preceding a plasma process phase. For example, a first recipe phase may include instructions for setting a flow rate of an inert and/or a reactant gas, instructions for setting a plasma generator to a power set point, and time delay instructions for the first recipe phase. A second, subsequent recipe phase may include instructions for enabling the plasma generator and time delay instructions for the second recipe phase. A third recipe phase may include instructions for disabling the plasma generator and time delay instructions for the third recipe phase. It will be appreciated that these recipe phases may be further subdivided and/or iterated in any suitable way within the scope of the present disclosure.

In some deposition processes, plasma strikes last on the order of a few seconds or more in duration. In certain implementations, much shorter plasma strikes may be used. These may be on the order of 10 ms to 1 second, typically, about 20 to 80 ms, with 50 ms being a specific example. Such very short RF plasma strikes require extremely quick stabilization of the plasma. To accomplish this, the plasma generator may be configured such that the impedance match is set preset to a particular voltage, while the frequency is allowed to float. Conventionally, high-frequency plasmas are generated at an RF frequency at about 13.56 MHz. In various embodiments disclosed herein, the frequency is allowed to float to a value that is different from this standard value. By permitting the frequency to float while fixing the impedance match to a predetermined voltage, the plasma can stabilize much more quickly, a result which may be important when using the very short plasma strikes associated with some types of deposition cycles.

RF power supply 714 and matching network 716 may be omitted in certain cases where the protective film is formed through a thermally driven reaction rather than a plasma driven reaction. However, the RF power supply 714 and matching network 716 may be useful for non-deposition related processes such as chamber cleaning and/or film treatment.

In some embodiments, pedestal 708 may be temperature controlled via heater 710. Further, in some embodiments, pressure control for deposition process station 700 may be provided by butterfly valve 718. As shown in the embodiment of FIG. 7, butterfly valve 718 throttles a vacuum provided by a downstream vacuum pump (not shown). However, in some embodiments, pressure control of process station 700 may also be adjusted by varying a flow rate of one or more gases introduced to process station 700.

System Controller

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable end-point measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The various hardware and method embodiments described above may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility.

Lithographic patterning of a film typically comprises some or all of the following steps, each step enabled with a number of possible tools: (1) application of photoresist on a workpiece, e.g., a substrate having a silicon nitride film formed thereon, using a spin-on or spray-on tool; (2) curing of photoresist using a hot plate or furnace or other suitable curing tool; (3) exposing the photoresist to visible or UV or x-ray light with a tool such as a wafer stepper; (4) developing the resist so as to selectively remove resist and thereby pattern it using a tool such as a wet bench or a spray developer; (5) transferring the resist pattern into an underlying film or workpiece by using a dry or plasma-assisted etching tool; and (6) removing the resist using a tool such as an RF or microwave plasma resist stripper. In some embodiments, an ashable hard mask layer (such as an amorphous carbon layer) and another suitable hard mask (such as an antireflective layer) may be deposited prior to applying the photoresist.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated may be performed in the sequence illustrated, in other sequences, in parallel, or in some cases omitted. Likewise, the order of the above described processes may be changed. Certain references have been incorporated by reference herein. It is understood that any disclaimers or disavowals made in such references do not necessarily apply to the embodiments described herein. Similarly, any features described as necessary in such references may be omitted in the embodiments herein.

The subject matter of the present disclosure includes all novel and nonobvious combinations and sub-combinations of the various processes, systems and configurations, and other features, functions, acts, and/or properties disclosed herein, as well as any and all equivalents thereof.

Experimental

Figure 8A:
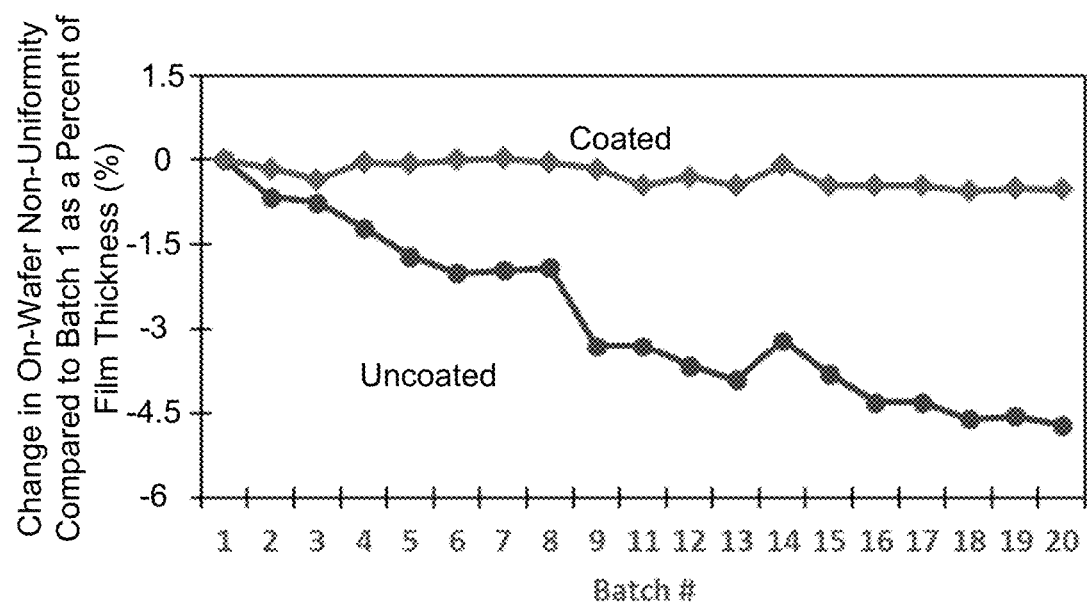
FIGS. 8A and 8B are graphs comparing batch-to-batch variations (FIG. 8A) and within-batch variations (FIG. 8B)

FIG. 8A depicts a graph illustrating the change in on-wafer non-uniformity as a percent of film thickness experienced over the course of depositing 200 Å thick silicon carbide film on semiconductor wafers in 20 batches. The graph includes results for both (1) a reaction chamber that included a showerhead and substrate support pedestal coated with aluminum oxide using the ex situ atomic layer deposition techniques described herein, and (2) a reaction chamber that included a showerhead and support pedestal that were uncoated. Because the first batch is used as a baseline from which the change in on-wafer non-uniformity is calculated, the first batch in each case shows a change in on-wafer non-uniformity of 0%.

Each batch included about 50 wafers, which were processed serially within the batch. The on-wafer non-uniformity was measured for the first wafer processed in each batch. This value was used as a baseline for tracking the variation in on-wafer non-uniformity for all the remaining batches. As a byproduct of the film deposition on the wafers, unwanted material built up on the internal chamber surfaces over the course of each batch. After all the wafers in a batch were processed, the reaction chamber used to process the wafers was subjected to a cleaning cycle by exposing the reaction chamber to nitrogen fluoride plasma. The fluorine radicals in the plasma acted to remove the material that was built up on the chamber surfaces over the course of depositing the film on the wafers, thereby cleaning the reaction chamber.

The y-axis in FIG. 8A relates to the change (as a comparison to batch 1) in the on-wafer non-uniformity as a percent of the average film thickness. As mentioned above, this on-wafer non-uniformity was measured for the first wafer in each batch. It is desirable for this on-wafer non-uniformity to be stable over the course of a batch and between different batches. With reference to FIG. 8A, it is desirable for the change in on-wafer non-uniformity to remain around 0 over the course of the different batches.

The lower line in FIG. 8A corresponds to the case where the showerhead and substrate support pedestal were uncoated. Over time, there was a substantial change (e.g., a decrease of about 5%) in the on-wafer non-uniformity compared to batch 1, as a percent of average film thickness. This trend illustrates that the on-wafer non-uniformity is very unstable when the showerhead and substrate support pedestal are uncoated. This instability is not desirable. Without wishing to be bound by theory or mechanism of action, it is believed that this instability arises as a result of the aluminum 6061-T6 showerhead surface converting to aluminum fluoride (to some degree) each time the showerhead is exposed to the nitrogen fluoride cleaning plasma. This phenomenon is one of the reasons that conventional showerheads need to be periodically replaced. It is believed that the use of a showerhead (and, optionally, other chamber components) coated ex situ with a protective coating as described herein substantially improves the resistance of the showerhead to nitrogen fluoride cleaning plasma (as well as ammonia plasma), meaning that each showerhead can be used for a longer time, with more stable processing results. This can significantly reduce semiconductor fabrication costs over time.

The upper line in FIG. 8A corresponds to the case where the showerhead and substrate support pedestal were coated with aluminum oxide using the techniques described herein. In this case, the on-wafer non-uniformity was substantially more stable from batch to batch, showing very little variation between the first batch and the 20th batch. In fact, among the 20 batches, the variation in the on-wafer non-uniformity was only about 0.05% of the average film thickness for the substrates that were tested. This stability represents a significant improvement, indicating that the protective coating is adequately protecting the chamber components from degradation due to plasma exposure. By the end of the 20 batches, the variation in on-wafer non-uniformity was approximately 20 times higher for the case where the chamber components were uncoated compared to the case where the chamber components were coated.

Figure 8B:
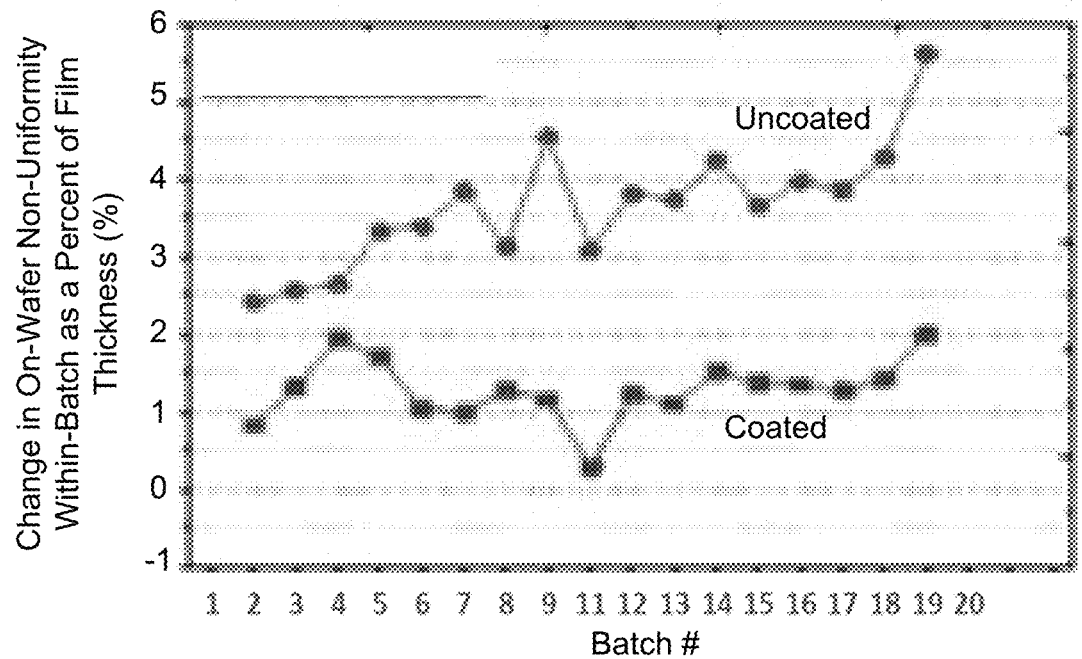

FIG. 8B presents a graph illustrating the change in on-wafer non-uniformity within each batch as a percent of average film thickness for 20 different batches. The within-batch change in on-wafer non-uniformity for each batch is calculated as the on-wafer non-uniformity of the last wafer in the batch minus the on-wafer non-uniformity of the first wafer in the batch. In FIG. 8B this is value is reported as a percent of the average film thickness. In other words, the y-axis in FIG. 8B indicates how much trending there was in the on-wafer non-uniformity over the course of each individual batch, over 20 total batches. It is desirable for this value to be both low and stable over time. The graph includes results for both (1) a reaction chamber that included a showerhead and substrate support pedestal coated with aluminum oxide using the ex situ atomic layer deposition process described herein, and (2) a reaction chamber that included a showerhead and substrate support pedestal that were uncoated. For the reaction chamber with the uncoated showerhead and pedestal, the within-batch on-wafer non-uniformity rose over the course of the 20 batches. Like the results in FIG. 8A, this instability is undesirable. By contrast, the reaction chamber with the coated showerhead and pedestal showed a more stable within-batch on-wafer non-uniformity over the course of the batches. Moreover, the within-batch change in on-wafer non-uniformity was lower in general when the chamber components were coated, as compared to the uncoated case, indicating less extensive trending of on-wafer non-uniformity within each batch where the coated chamber components are used. The results in FIGS. 8A and 8B indicate that the coated chamber components provide substantial improvements in terms of repeatability and uniform processing results.

Additional experimental results have shown that the ex situ deposited protective coatings described herein are highly resistant to fluorine-containing plasmas such as $NF_3$ plasma and to reducing plasmas such as ammonia plasma. For instance, a showerhead having a 500 nm thick protective coating of aluminum oxide deposited ex situ through thermally driven atomic layer deposition was repeatedly exposed to either an $NH_3$ plasma or an ammonia plasma, as the reaction chamber in which the showerhead was installed was used to deposit film on about 5,000 semiconductor substrates. Even after repeated exposures to $NH_3$ plasma, nitrogen was only able to penetrate to a depth of approximately 30 nm on the showerhead, reaching a maximum concentration of about 5% atomic nitrogen. Similarly, after repeated exposures to $NF_3$ plasma, the fluorine was only able to penetrate to a depth of approximately 40 nm within the coating on the showerhead, reaching a maximum concentration of about 10% atomic fluorine.

Together, these results show that the ex situ ALD coating techniques described herein can be used to form high quality protective coatings on chamber components, where the protective coatings provide substantial resistance to nitrogen fluoride plasma and ammonia plasma. Because these plasmas are commonly used to clean reaction chambers, it is important for the protective coating to withstand exposure to these plasmas over repeated cleaning cycles. This resistance ensures that the coated chamber component can have a long useful lifetime once it is installed in a reaction chamber, operating to prevent or otherwise minimize contamination that would otherwise result if the chamber component were uncoated.

FIG. 9 is a graph that illustrates the effectiveness of an aluminum oxide protective coating for minimizing unwanted particle generation. A protective coating of aluminum oxide was deposited ex situ through atomic layer deposition on a showerhead. The showerhead was installed in a reaction chamber used to process semiconductor substrates, and was subjected to 10,000 wafer equivalent cycles. In other words, the gases entering the chamber deposited CVD films on 10,000 wafers. Certain wafers were analyzed to evaluate the number of particles observed on the wafer surface. As shown in FIG. 9, this analysis on semiconductor wafers occurred after about 2000 wafer equivalent cycles, after about 7000 wafer equivalent cycles, after about 9000 wafer equivalent cycles, after about 10,000 wafer equivalent cycles, and after 13,000 wafer equivalent cycles. Up through 10,000 wafer equivalent cycles on the showerhead, five or fewer particle adders (>0.045 µm) were observed on each semiconductor wafer.

Additional experimental results have shown that an aluminum oxide protective coating can be formed in a highly conformal manner over a variety of surface geometries and defects.

FIGS. 10A and 10B provide experimental results which show that a restoration plasma can be used to restore a reaction chamber (and coated components therein) to a desirable state in a very quick manner. FIG. 10A shows the fill parameter in the case of (1) a reaction chamber that is in a high fill parameter state and (2) a reaction chamber that is in a low fill parameter state. The fill parameter reflects the fill performance on a semiconductor wafer processed in the reaction chamber.

Generally, it is desirable for the fill parameter to be uniform over time as additional semiconductor wafers are processed in the reaction chamber. Such uniformity in the reaction chamber leads to greater uniformity in the processing results on the semiconductor wafers. The desired fill parameter for this particular example is shown between the two dotted horizontal lines. The desired fill parameter may be outside these values in other applications. In the example of FIGS. 10A and 10B, it is desirable to operate the reaction chamber under a high fill parameter state (e.g., the high fill parameter state, shown on the left of FIG. 10A, exhibits a fill parameter that is within the dotted horizontal lines).

However, various processing operations can alter the conditions within the reaction chamber, changing the reaction chamber from a high fill parameter state to a low fill parameter state. In the example of FIGS. 10A and 10B, the low fill parameter state exhibits a fill parameter that is much lower than the desired range. Operations that can lower the fill parameter may include, but are not limited to, events such as pump issues, abatement issues, chamber generator issues, chamber brought down improperly, etc. Further, events that affect the properties of the coating on the coated chamber components (e.g., causing fluorination or nitridation of an oxide coating, for instance) can significantly affect the fill parameter. Additionally, even the process of operating or idling the reaction chamber can change the state of the reaction chamber. As such, the reaction chamber may change/drift from a high fill parameter state to a low fill parameter state over the course of processing one or more semiconductor wafers therein, or over the course of an idle period. In various cases, the reaction chamber may change from a high fill parameter state to a low fill parameter state after continuous operation to process a batch of semiconductor wafers therein.

The wafers are processed serially at different times over the course of the batch, though in some cases the apparatus may be configured to simultaneously process multiple wafers, e.g., at different stations. Each batch of wafers includes all of the wafers processed in a particular reaction chamber in between full chamber cleaning operations (which typically involves, e.g., substantially removing any byproducts built up on chamber surfaces). In some cases, a batch may include a few tens of semiconductor wafers. In other cases, the batches are much larger, including, e.g., a few hundred semiconductor wafers.

Because it is desirable to operate a reaction chamber at a uniform chamber state over time (e.g., such that the fill parameter remains uniform over time), and because normal processing operations may tend to decrease the fill parameter, there are times when it is desirable to increase the fill parameter of the reaction chamber. Increasing the fill parameter restores the chamber to the high fill parameter state, such that the semiconductor wafers can be processed under the same conditions as those that were processed earlier.

One method that may be used to change the reaction chamber from a low fill parameter state to a high fill parameter state is waiting an extended period of time (e.g., many hours, typically longer than 10 hours). In cases where the fill parameter decreases over the course of processing as a result of nitrogen attaching to coated chamber components (e.g., due to exposure of the coated chamber components to nitrogen-containing plasma), the fill parameter may slowly increase over the course of the extended period of waiting time as nitrogen radicals are desorbed from the coated chamber component. Similar desorption may occur for other unwanted materials present on the coated chamber components. However, this waiting technique is not always successful in recovering the reaction chamber and re-establishing the high fill parameter state. Previously, in cases where waiting was not successful, the coated chamber components were typically scrapped, and new coated chamber components were provided to the reaction chamber. Such replacements can be costly over time, both in terms of the cost of the replacement parts themselves, and in terms of the downtime/lost productivity involved with waiting and replacing the parts, as needed.

Another technique for restoring the reaction chamber to the high fill parameter state is to expose the reaction chamber to a restoration plasma, as described above. The restoration plasma quickly restores the chamber from the low fill parameter state to the high fill parameter state, without the need to wait several hours for the nitrogen (or other unwanted material) to desorb from the coated chamber components. This substantially decreases the time over which the reaction chamber is unavailable for processing on semiconductor substrates, thus increasing throughput and maximizing value.

FIG. 10B illustrates the fill parameter for a reaction chamber both before application of a restoration plasma, and after application of the restoration plasma. Before the reaction chamber was exposed to the restoration plasma, it was in a low fill parameter state. The reaction chamber was then exposed to a restoration plasma generated from a mixture of $O_2$ and Ar for a duration of about 20 minutes. After exposure to the restoration plasma, the fill parameter increased substantially, bringing the reaction chamber back to a high fill parameter state. These results indicate that the restoration plasma may be used to quickly restore the reaction chamber to a desired state, thereby achieving very uniform on-wafer results.

FIGS. 11A and 11B illustrate the fill parameter of a reaction chamber as the reaction chamber is used to process several hundred semiconductor wafers over time. In these examples, the showerhead was coated with aluminum oxide deposited ex situ through atomic layer deposition, as described herein. In FIG. 11A, the reaction chamber was exposed to plasma generated from a mixture of $N_2$/Ar for a duration of about 1 second after each semiconductor wafer was processed therein. The $N_2$/Ar plasma was provided as a waferless conditioning (e.g., restoration plasma) operation, meaning that no semiconductor wafers were present in the reaction chamber during the plasma exposure. In FIG. 11B, the reaction chamber was exposed to a staged waferless conditioning (e.g., staged restoration plasma) process involving exposure to $O_2$/Ar plasma for a duration of about 1 minute, followed by exposure to $N_2$/Ar plasma for a duration of about 1 second. In the case of FIG. 11A, the fill parameter drifted downwards by approximately 0.009/wafer (approximately 4.5 units over the course of 500 wafers). By contrast, where the staged waferless conditioning (e.g., staged restoration plasma) was used with both $O_2$ and $N_2$ plasmas, the fill parameter drifted downwards by a much smaller amount, only about 0.0007/wafer (approximately 0.49 units over the course of 700 wafers). This represents a substantial improvement. Specifically, the drift in fill parameter per wafer decreased by an order of magnitude when staged conditioning was used employing both $O_2$ and $N_2$ plasmas.

FIG. 12A illustrates the deposition parameter vs. wafer number as additional semiconductor wafers are processed over time in a chemical vapor deposition chamber where the showerhead is cooled to a temperature of about 25° C. during processing. Like the fill parameter described in relation to FIGS. 10A, 10B, 11A, and 11B, the deposition parameter of FIGS. 12A-12H reflects the fill performance on a semiconductor wafer processed in the reaction chamber. It is desirable for the deposition parameter to be constant over time, for the same reasons it is desirable for the fill parameter to be constant.

In this case, the deposition parameter trended substantially downward over the course of processing 60 semiconductor wafers. This trending is not desirable. FIGS. 12B-12H illustrate deposition parameter vs. wafer number as additional wafers are processed over time in a chemical vapor deposition reaction chamber where the showerhead was heated to a temperature of about 70° C. during processing. FIG. 12B shows wafer numbers 1-20, FIG. 12C shows wafer numbers 100-120, FIG. 12D shows wafer numbers 200-220, FIG. 12E shows wafer numbers 215-235, FIG. 12F shows wafer numbers 320-335, FIG. 12G shows wafer numbers 420-435, and FIG. 12H shows wafer numbers 520-545. In each of FIGS. 12A-12H, the showerhead was coated with aluminum oxide deposited ex situ through atomic layer deposition, as described herein.

As shown in FIGS. 12B-12H, the use of a heated showerhead substantially increases the uniformity of the deposition parameter. The x-axis in each graph represents the wafer number, with wafers being processed earlier having lower wafer numbers and those being processed later having higher wafer numbers. The y-axis in each graph represents the deposition parameter. It is desirable for the data points in these graphs to be flat/horizontal, which indicates uniformity over time for different wafers. Generally, the highest quality processing results were observed when the coated showerhead was maintained at a temperature of at least about 70° C. In some cases, the showerhead may be heated to a temperature between about 70-200° C. during processing. In other cases, the showerhead may be heated to a temperature between about 40-200° C.

A few events are worth noting in FIGS. 12B-12H. In FIG. 12E, there was a 12 hour idle time provided between two of the wafers (e.g., between wafer numbers 220 and 221, approximately, shown by the dotted vertical line). After the 12 hour idle, the first wafer processed showed a deposition parameter that was noticeably higher than the previous deposition parameter. After this, the deposition parameter decreased and eventually returned to a steady value. The increase in deposition parameter immediately following the idle period is not desirable. In FIG. 12H, a second idle period was employed, as indicated by the dotted vertical line. In this case, the idle was longer, at about 36 hours. After idling but prior to processing the next wafer, the reaction chamber was exposed to a restoration plasma generated from $O_2$ and Ar. The restoration plasma eliminates the increase in the deposition parameter that was observed after the 12 hour idle in FIG. 12E. Instead of spiking upwards after idling, the deposition parameter remains at a uniform level compared to what it was prior to idling. This level of uniformity, even after a long idle period, is highly desirable.

In the above description, numerous specific details are set forth in order to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments. Unless otherwise defined for a particular parameter, the terms "about" and "approximately" as used herein are intended to mean±10% with respect to a relevant value.

What is claimed is:

1. A method of coating a chamber component, the method comprising:
  (a) receiving the chamber component as a substrate in a first reaction chamber;
  (b) reacting a first reactant with a second reactant in the first reaction chamber to form a protective coating on a surface of the chamber component;
  (c) repeating (b) until the protective coating reaches a final thickness; and
  (d) removing the chamber component from the first reaction chamber;
  (e) installing the chamber component in a second reaction chamber; and
  (f) exposing the second reaction chamber to a restoration plasma while the chamber component is installed therein to re-form the protective coating on the chamber component.

2. The method of claim 1, wherein the protective coating comprises a metal oxide, a metal nitride, or a metal fluoride.

3. The method of claim 2, wherein the metal in the metal oxide, metal nitride, or metal fluoride is a transition metal.

4. The method of claim 2, wherein the protective coating comprises aluminum oxide, aluminum fluoride, or aluminum nitride.

5. The method of claim 2, wherein the protective coating comprises yttrium oxide or yttrium fluoride.

6. The method of claim 1, further comprising depositing a film on a semiconductor wafer in the second reaction chamber after installing the chamber component therein, wherein the film is deposited through atomic layer deposition or chemical vapor deposition.

7. The method of claim 6, further comprising establishing an elevated temperature in the second reaction chamber while depositing the film on the semiconductor wafer, the elevated temperature being between about 40-200° C.

8. The method of claim 6, wherein either:
  (a) the protective coating comprises a metal oxide and the restoration plasma comprises an oxidizing plasma,
  (b) the protective coating comprises a metal nitride and the restoration plasma comprises nitrogen, or
  (c) the protective coating comprises a metal fluoride and the restoration plasma comprises fluorine.

9. The method of claim 8, wherein the restoration plasma further comprises a metal that is the same as a metal in the protective coating.

10. The method of claim 6, further comprising after depositing the film on the semiconductor wafer in the second reaction chamber, removing the semiconductor wafer from the second reaction chamber, and exposing the second reaction chamber to a first plasma comprising oxygen, then exposing the second reaction chamber to a second plasma comprising nitrogen.

11. The method of claim 6, further comprising cleaning the second reaction chamber by exposing the second reaction chamber to a fluorine-containing plasma, then removing fluorine from the second reaction chamber by exposing the second reaction chamber to a reducing plasma.

12. The method of claim 1, wherein the protective coating forms without exposing the chamber component to plasma.

13. The method of claim 1, wherein a plurality of chamber components are provided to the first reaction chamber simultaneously, the plurality of chamber components including the chamber component, such that the protective coating forms on the plurality of chamber components simultaneously.

14. The method of claim 13, wherein the plurality of chamber components do not have a uniform size and/or shape, and, wherein the plurality of chamber components comprise a first chamber component and a second chamber component, further comprising installing the first and second chamber components in a second reaction chamber such that they are simultaneously present within the second reaction chamber.

15. The method of claim 1, wherein the final thickness of the protective coating is between about 1 nm and 10 mm.

16. The method of claim 1, further comprising masking a portion of the chamber component before (b) to prevent the protective coating from forming on the portion of the chamber component that is masked.

17. The method of claim 1, further comprising positioning the chamber component on a substrate support within the first reaction chamber, such that one or more surfaces of the chamber component where the protective coating is desired are substantially exposed, and further comprising re-positioning the chamber component within the first reaction chamber from a first position to a second position, wherein the protective coating forms over a first set of surfaces of the chamber component when oriented in the first position, and forms over a second set of surfaces of the chamber component when oriented in the second position.

18. The method of claim 1, wherein the chamber component is a showerhead.

19. The method of claim 18, wherein the showerhead comprises a first set of holes that extend through a thickness of the showerhead and a second set of holes that connect with one or more internal passages within the showerhead, wherein the protective coating conformally coats the first set of holes, the second set of holes, and the internal passages.

* * * * *